(12) United States Patent  
McKee et al.

(10) Patent No.: US 12,365,981 B2  
(45) Date of Patent: *Jul. 22, 2025

(54) SYNTHESIS AND USE OF PRECURSORS FOR ALD OF MOLYBDENUM OR TUNGSTEN CONTAINING THIN FILMS

(71) Applicant: ASM IP HOLDING B.V., Almere (NL)

(72) Inventors: Tiina McKee, Espoo (FI); Timo Hatanpää, Espoo (FI); Mikko Ritala, Espoo (FI); Markku Leskela, Espoo (FI)

(73) Assignee: ASM IP Holding B.V., Almere (NL)

( * ) Notice: Subject to any disclaimer, the term of this patent is extended or adjusted under 35 U.S.C. 154(b) by 13 days.

This patent is subject to a terminal disclaimer.

(21) Appl. No.: 18/180,056

(22) Filed: Mar. 7, 2023

(65) Prior Publication Data

US 2023/0227977 A1 Jul. 20, 2023

Related U.S. Application Data

(63) Continuation of application No. 17/323,887, filed on May 18, 2021, now Pat. No. 11,624,112, which is a (Continued)

(51) Int. Cl.
*C23C 16/455* (2006.01)
*C23C 16/16* (2006.01)
(Continued)

(52) U.S. Cl.
CPC .......... *C23C 16/305* (2013.01); *C23C 16/16* (2013.01); *C23C 16/45536* (2013.01);
(Continued)

(58) Field of Classification Search
None
See application file for complete search history.

(56) References Cited

U.S. PATENT DOCUMENTS 3,098,350 A * 7/1963 Barry ................. C06D 5/04
149/89
3,429,903 A 2/1969 Larson
(Continued)

FOREIGN PATENT DOCUMENTS

CN 101117308 2/2008
CN 101337828 A 1/2009
(Continued)

OTHER PUBLICATIONS

M. Diskus et al., 21 Journal of Materials Chemistry, 705-710 (2011) (Year: 2011).*
(Continued)

*Primary Examiner* — Alexander R Pagano
(74) *Attorney, Agent, or Firm* — Banner & Witcoff, Ltd.

(57) ABSTRACT

Processes for forming Mo and W containing thin films, such as $MoS_2$, $WS_2$, $MoSe_2$, and $WSe_2$ thin films are provided. Methods are also provided for synthesizing Mo or W beta-diketonate precursors. Additionally, methods are provided for forming 2D materials containing Mo or W.

6 Claims, 23 Drawing Sheets

Related U.S. Application Data continuation of application No. 15/569,707, filed as application No. PCT/US2016/033955 on May 24, 2016, now Pat. No. 11,047,042.

(60) Provisional application No. 62/181,126, filed on Jun. 17, 2015, provisional application No. 62/167,220, filed on May 27, 2015.

(51) Int. Cl.
  *C23C 16/30* (2006.01)
  *H01L 21/02* (2006.01)
  *C01G 39/06* (2006.01)
  *G01N 30/72* (2006.01)

(52) U.S. Cl.
  CPC .. *C23C 16/45553* (2013.01); *H01L 21/02568* (2013.01); *H01L 21/0262* (2013.01); *C01G 39/06* (2013.01); *C01P 2004/03* (2013.01); *G01N 30/72* (2013.01)

(56) References Cited

U.S. PATENT DOCUMENTS

| | | | |
|---|---|---|---|
| 3,784,631 | A | 1/1974 | Menapace et al. |
| 5,028,724 | A | 7/1991 | Ivankovits et al. |
| 5,840,897 | A * | 11/1998 | Kirlin ............... C07F 19/005 556/136 |
| 6,110,529 | A | 8/2000 | Gardiner et al. |
| 6,126,996 | A | 10/2000 | Kirlin et al. |
| 6,258,157 | B1 | 7/2001 | Gordon |
| 6,444,264 | B2 * | 9/2002 | Hintermaier ........ C23C 16/448 106/287.18 |
| 7,034,169 | B1 | 4/2006 | Norman |
| 7,323,581 | B1 | 1/2008 | Gardiner et al. |
| 7,638,645 | B2 | 12/2009 | Gordon et al. |
| 8,142,847 | B2 | 3/2012 | Shenai-Khatkhate et al. |
| 8,188,464 | B2 | 5/2012 | Quick |
| 8,299,286 | B2 * | 10/2012 | Gardiner ............ C23C 16/405 556/40 |
| 9,240,319 | B2 | 1/2016 | Gatineau et al. |
| 9,536,782 | B2 | 1/2017 | Hotta et al. |
| 9,802,220 | B2 | 10/2017 | Heys et al. |
| 9,911,590 | B2 | 3/2018 | Dussarrat et al. |
| 10,131,984 | B2 | 11/2018 | Okada |
| 10,358,407 | B2 * | 7/2019 | Hatanp ............ C23C 16/45553 |
| 11,047,042 | B2 * | 6/2021 | McKee ................ C23C 16/16 |
| 11,624,112 | B2 * | 4/2023 | McKee ............ C23C 16/45553 427/255.28 |
| 2003/0008072 | A1 | 1/2003 | Lee et al. |
| 2004/0043557 | A1 | 3/2004 | Haukka et al. |
| 2004/0224504 | A1 | 11/2004 | Gadgil |
| 2008/0102205 | A1 | 5/2008 | Barry et al. |
| 2013/0295483 | A1 * | 11/2013 | Monden ............ B01J 31/1658 502/181 |
| 2014/0141165 | A1 | 5/2014 | Sato et al. |
| 2015/0211112 | A1 | 7/2015 | Cadot et al. |
| 2016/0122868 | A1 | 5/2016 | Kim et al. |
| 2018/0099916 | A1 | 4/2018 | Hatanpaa et al. |
| 2021/0246095 | A1 | 8/2021 | Hatanpaa et al. |

FOREIGN PATENT DOCUMENTS

| | | |
|---|---|---|
| CN | 101343732 | 1/2009 |
| CN | 101500989 | 8/2009 |
| CN | 101982562 | 3/2011 |
| CN | 104561937 | 4/2015 |
| EP | 1983073 | 10/2008 |
| GB | 982916 A * | 2/1965 |
| JP | H11-507629 A | 7/1999 |
| JP | 2000-086217 A | 3/2000 |
| JP | 2004-507551 | 3/2004 |
| JP | 2009-542654 | 12/2009 |
| JP | 2010-226092 | 10/2010 |
| JP | 2011-246466 | 12/2011 |
| JP | 2012-99594 | 5/2012 |
| JP | 2012-209413 | 10/2012 |
| KR | 1020080021709 | 3/2008 |
| KR | 1020090007245 | 1/2009 |
| KR | 101464173 | 11/2014 |
| KR | 1020150111302 | 10/2015 |
| WO | WO 96/40690 | 12/1996 |
| WO | WO 0218394 | 3/2002 |
| WO | WO 2008/002546 | 1/2008 |
| WO | WO 2010/114386 | 10/2010 |
| WO | WO 2015016412 | 2/2015 |
| WO | WO 2015/056944 | 4/2015 |

OTHER PUBLICATIONS

K. Christ et al., 2 Angew. Chem Internat. Edit., 97 (1963) (Year: 1963).*

CAS/CAPLUS Abstract and Indexed Compounds, K. Christ et al., 2 Angew. Chem internat. Edit., 97 (1963) (Year: 1963).*

CAS/CAPLUS Abstract and Indexed Compounds, R. Gardiner et al., U.S. Pat. No. 8,299,286 (2012) (Year: 2012).*

CAS Abstract and Indexed Compound, E. Mazurenko et al., Probl. Khim. Primen. B [Beta]-Diketonatov Met., [Mater. Vses. Semin.] (1982), (Meeting Date 1978), pp. 61-64 (Year: 1982).*

CAS Abstract and Indexed Compound C. Berding et al., GB 982916 (1965) (Year: 1965).*

Baxter et al., "Chemical vapour deposition of electrochromic tungsten oxide films employing volatile tungsten(v1) 0x0 alkoxide/ β-diketonate complexes", Chem. Commun., 1996, pp. 1129-1130.

Bonsu et al., "Synthesis and evaluation of κ2-β-diketonate and β-ketoesterate tungsten(VI) oxo-alkoxide complexes as precursors for chemical vapor deposition of WO$\chi$ thin films", Dalton Trans., 2016, 45, pp. 10897-10908.

Browning et al., "Atomic layer deposition of MoS2 films", Mater. Res. Express 2, 2015, 6 pages.

Buono-Core et al., "Synthesis and evaluation of bis-β-diketonate dioxotungsten(VI) complexes as precursors for the photodeposition of WO3 films", Polyhedron, 30, 2011, pp. 201-206.

Chisholm et al., "The Molybdenum-Molybdenum Triple Bond. 13.1 Preparations and Characterization of Bis(p.diketonato)tetraalkoxydimolybdenum and-ditungsten Compounds", Inorg. Chem., 1984, 23, pp. 613-618.

Chisholm et al., "Reactions of Metal-Metal Multiple Bonds. 11.1 A Comparison of the Reactivity of M2(OR)6 (M=M) and M2(OR)4(R'COCHCOR')2 (M=M) Compounds (M = Mu, W) with the π-Acid Ligands Co, RC=CR, and RNC", Inorg. Chem., 1984, 23, pp. 1037-1042.

Chisholm et al., "Attempts to prepare W2(β-diketonate)4(M4-M) complexes by reductiye elimination fromd3-d3 ditungsten complexes. Preparation and structures of W2 R 2(NMe2)2 (But-acac)2 and W2 R 2(OPri )2 (But-acac)2 compounds, whereR=Et, Ph, CH2Ph, and BCi", Journal of Cluster Science, Mar. 1994, vol. 5, Issue 1, pp. 67-82.

Christ et al., "Complexes of Molybdenum(III) with 1,3-Diketones", Angew. Chem. Internat. Edit., vol. 2 (1963), No. 2.

Doyle, Gerald, "The Reaction of Some Molybdenum and Tungsten Halides with .beta.-Diketones", Inorganic Chemistry, vol. 10, No. 10, 1971, pp. 2348-2350.

International Search Report and Written Opinion for International Application No. PCT/US2016/033955, Notification mailed Oct. 18, 2016.

Kang et al., "High-mobility three-atom-thick semiconducting films with wafer-scale homogeneity", Nature, Apr. 30, 2015, vol. 520, pp. 656-660.

Lee et al., "Effects of Oxidation State and Crystallinity of Tugsten Oxide Interlayer on Photovoltaic Property in Bulk Hetero-Junction Solar Cell", J. Phys. Chem. 2012, 116, pp. 13480-13487.

Mattinen et al., "Atomic Layer Deposition of Crystalline MoS2 Thin Films: New Molybdenum Precursor for Low-Temperature Film Growth", Adv. Mater. Interfaces, 2017, 4, 1700123 (11 pages).

(56) References Cited

OTHER PUBLICATIONS

Mazurenko et al., "Synthesis, thermal stability, and IR and UV spectra of molybdenum and tungsten β-diketone complexes", Probl. Khim. Primen. β [Beta]-Diketonatov Met., [Mater. Vses. Semin.] (1982).

McAleese et al., "The use of Ce(fod)4 as a precursor for the growth of ceria films by metal-organic chemical vapour deposition", Thin Solid Films 280 (1996) pp. 152-159.

Song et al., "Synthesis and characterization of volatile metal β-diketonate chelates of M(DPM)n (M=Ce, Gd, Y, Zr, n=3,4) used as precursors for MOCVD", Journal of Crystal Growth 250 (2003) pp. 423-430.

Stoffelbach et al., "Improved preparations of molybdenum coordination compounds from tetrachlorobis (diethyl ether) molybdenum (IV)", European International Journal of Inorganic Chemistry, pp. 2699-2703 (2001).

Yoshimura et al., "Some β-Diketone Chelate Complexes with Uranium(IV), Thorium(IV), and Cerium(IV). Preparation and IR Spectra", Bulletin of the Chemical Society of Japan, vol. 46, pp. 2096-2101 (1973).

Zelazowlska et al., "WO3-based electrochromic system with hybrid organic-inorganic gel electrolytes", Journal of Non-Crystalline Solids, 354, 2008, pp. 4500-4505.

\* cited by examiner

SYNTHESIS AND USE OF PRECURSORS FOR ALD OF MOLYBDENUM OR TUNGSTEN CONTAINING THIN FILMS

CROSS-REFERENCE TO RELATED APPLICATIONS

The present application is a continuation of U.S. application Ser. No. 17/323,887, filed May 18, 2021, which is a continuation of U.S. application Ser. No. 15/569,707, filed Oct. 26, 2017, now U.S. Pat. No. 11,047,042, which is the U.S. National Phase of International Application PCT/US2016/033955, filed May 24, 2016, which claims priority under 35 U.S.C. § 119(e) to U.S. Provisional Patent Application No. 62/167,220 filed on May 27, 2015 and U.S. Provisional Patent Application No. 62/181,126 filed on Jun. 17, 2015, the entireties of which are hereby incorporated by reference.

PARTIES OF JOINT RESEARCH AGREEMENT

The invention claimed herein was made by, or on behalf of, and/or in connection with a join research agreement between the University of Helsinki and ASM Microchemistry Oy. The agreement was in effect on and before the date the claimed invention was made, and the claimed invention was made as a result of activities undertaken within the scope of the agreement.

BACKGROUND

Field

The present application relates generally to precursors and methods for forming thin films comprising molybdenum or tungsten by atomic layer deposition. Such films may find use, for example, as two-dimensional (2D) materials in electronic devices.

Description of the Related Art

Previous processes for atomic layer deposition (ALD) of any kind of thin films containing molybdenum were limited to a select few known molybdenum precursors, such as $MoCl_5$, $Mo(CO)_6$, and alkylamine precursors such as $Mo(N^tBu)_2(NMe_2)_2$ and $Mo(N^tBu)_2(NEt_2)_2$. Recently reported precursor combinations for the deposition of $MoS_2$ thin films include $Mo(CO)_6$ and $H_2S$, $Mo(CO)_6$ and MeSSMe, and $MoCl_5$ and $H_2S$. However, these traditional molybdenum precursors can prove difficult to work with. For example, $Mo(CO)_6$ is a highly toxic material with a narrow temperature range for deposition that may be too low to deposit crystalline thin films containing molybdenum. $MoCl_5$, meanwhile, appears to require additional dwell time in order to successfully deposit a $MoS_2$ film.

Certain Mo alkylamine precursors may include Mo with an oxidation state of +VI which can cause problems during deposition of any kind of thin film containing molybdenum. Mo alkylamine precursors in which Mo has a more preferable oxidation state of +IV are generally unstable and difficult to use. Further, Mo alkylamine precursors are relatively temperature sensitive and can decompose at low temperatures. As relatively high temperatures are usually needed to promote crystal film growth, this can lead to decomposition of Mo alkylamine precursors. This decomposition can create impurities, such as carbon, which can slow or even prevent crystallization of any kind of thin films containing molybdenum.

Molybdenum(III) beta-diketonates have been utilized to deposit Mo containing thin films using chemical vapor deposition (CVD) processes, but have not been extensively investigated for use in ALD type processes. Previously disclosed processes for synthesis of molybdenum(III) beta-diketonates use $Mo(CO)_6$, $K_3MoCl_6$ and $(NH_4)_2[MoCl_5(H_2O)]$. Each of these compounds has significant drawbacks and can prove difficult to work with. For example, as mentioned above, $Mo(CO)_6$ is highly toxic and volatile, leading to increased difficulty in procedures where it is used. Laboratory synthesis of $K_3MoCl_6$ is laborious and necessitates electrochemical or high temperature processes.

Transition metal dichalcogenide materials, especially 2D transition metal dichalcogenide materials, such as Mo and W dichalcogenides have desirable electronic properties for a variety of applications. Additionally, unlike graphene, another two-dimensional material, certain two-dimensional transition metal dichalcogenides have a direct band gap and are semiconducting. Therefore, two-dimensional transition metal dichalcogenides such as Mo and W dichalcogenides are being looked at for application to device miniaturization.

SUMMARY

In some aspects, processes for forming a Mo or W containing thin film are provided. In some embodiments a Mo or W containing thin film is formed on a substrate in a reaction chamber in a process comprising at least one cycle, the cycle comprising contacting the substrate with a vapor phase Mo or W precursor such that at most a molecular monolayer of the first Mo or W precursor is formed on the substrate surface, removing excess Mo or W precursor and reaction byproducts, if any, contacting the substrate with a vapor phase chalcogen precursor, removing excess chalcogen precursor and reaction byproducts, if any, and optionally repeating the contacting and removing steps until a Mo or W containing thin film of the desired thickness is formed. In some embodiments the Mo or W in the Mo or W precursor has an oxidation state less than or equal to +IV, but not 0. In some embodiments the chalcogen precursor reacts with the Mo or W precursor on the substrate surface.

In some embodiments the process is an atomic layer deposition (ALD) process. In some embodiments the process comprises two or more sequential cycles. In some embodiments the Mo or W containing thin film is a Mo or W sulfide, selenide, or telluride thin film. In some embodiments the oxidation state of the Mo or W in the Mo or W precursor is +III. In some embodiments the chalcogen precursor comprises $H_2S$, $H_2Se$, $H_2Te$, $(CH_3)_2S$, $(CH_3)_2Se$, or $(CH_3)_2TSe$.

In some aspects, atomic layer deposition (ALD) processes for forming a Mo or W sulfide, selenide, or telluride thin film are provided. According to some embodiments, a Mo or W sulfide, selenide, or telluride thin film is formed on a substrate in a reaction chamber in an ALD process comprising at least one cycle, the cycle comprising contacting the substrate with a vapor phase Mo or W precursor such that at most a molecular monolayer of the first Mo or W precursor is formed on the substrate surface, removing excess Mo or W precursor and reaction byproducts, if any, contacting the substrate with a vapor phase chalcogen precursor, removing excess chalcogen precursor and reaction byproducts, if any, and repeating the contacting and removing steps until a Mo or W containing thin film of the desired thickness is formed.

In some embodiments the Mo or W precursor may comprise at least one bidentate ligand. In some embodiments the chalcogen precursor reacts with the Mo or W precursor on the substrate surface.

In some embodiments the bidentate ligand is bonded to the Mo or W atom through an O, S, or N atom. In some embodiments the bidentate ligand is bonded to the Mo or W atom through two O atoms. In some embodiments the bidentate ligand is bonded to the Mo or W atom through an O atom and an N atom. In some embodiments the bidentate ligand is bonded to the Mo or W atom through two N atoms. In some embodiments the bidentate ligand is a beta-diketonato ligand. In some embodiments the beta-diketonato ligand is an acetylacetonato (acac) ligand. In some embodiments the beta-diketonato ligand is a 2,2,6,6-tetramethyl-3, 5-heptanedionato (thd) ligand. In some embodiments the Mo or W precursor comprises at least two bidentate ligands. In some embodiments the Mo or W precursor comprises three bidentate ligands.

In some aspects, atomic layer deposition (ALD) processes for forming a Mo or W sulfide, selenide, or telluride 2D material are provided. According to some embodiments, a Mo or W sulfide, selenide, or telluride 2D material is formed on a substrate in a reaction chamber in an ALD process comprising at least one cycle, the cycle comprising contacting the substrate with a vapor phase Mo or W precursor such that at most a molecular monolayer of the first Mo or W precursor is formed on the substrate surface, removing excess Mo or W precursor and reaction byproducts, if any, contacting the substrate with a vapor phase sulfur, selenium, or tellurium precursor, and removing excess sulfur, tellurium or selenium precursor and reaction byproducts, if any. In some embodiments the Mo or W precursor is a Mo or W beta-diketonate precursor. In some embodiments the sulfur, selenium, or tellurium precursor reacts with the Mo or W precursor on the substrate surface.

In some aspects, processes for forming a Mo or W sulfide, selenide, or telluride 2D material are provided. According to some embodiments, a Mo or W sulfide, selenide, or telluride 2D material is formed on a substrate in a reaction chamber in an cyclic process comprising at least one cycle, the cycle comprising contacting the substrate with a vapor phase Mo or W precursor such that at most a monolayer, preferably less than or equal to about 50% of a monolayer, preferably less than about 25% of a monolayer, more preferably less than about 10% of a monolayer of the Mo or W containing material is formed on the substrate surface; exposing the substrate to purge gas and/or removing excess Mo or W precursor and reaction byproducts, if any; contacting the substrate with a vapor phase sulfur, selenium, or tellurium precursor; and exposing the substrate to purge gas and/or removing excess sulfur, tellurium or selenium precursor and reaction byproducts, if any. In some embodiments the Mo or W precursor is a Mo or W beta-diketonate precursor. In some embodiments the sulfur, selenium, or tellurium precursor reacts with the Mo or W containing material deposited on the substrate surface.

In some embodiments the Mo or W containing thin film is a Mo or W sulfide, selenide, or telluride thin film. In some embodiments the oxidation state of the Mo or W atom comprising the Mo or W precursor is +III. In some embodiments the chalcogen precursor comprises $H_2S$, $H_2Se$, $H_2Te$, $(CH_3)_2S$, $(CH_3)_2Se$, or $(CH_3)_2Te$. In some embodiments the Mo or W precursor is $Mo(thd)_3$ and the chalcogen precursor is $H_2S$. In some embodiments the Mo or W precursor is $W(thd)_3$ and the chalcogen precursor is $H_2S$. In some embodiments the 2D material comprises $MoS_2$.

In some aspects, methods for making Mo or W beta-diketonate precursors are provided. According to some embodiments, a Mo or W beta-diketonate precursor is formed by providing a first reactant having the formula $MX_3(R)n_3$, wherein n is a number from 0 to 4, M is Mo or W, X is a halide, and R is a solvent, forming a first product by reacting an alkali metal compound with a beta-diketonato compound, and subsequently adding the first product to the first reactant. In some embodiments a Mo or W beta-diketonate precursor is formed having the formula $ML_3$, wherein M is Mo or W and L is a beta-diketonato ligand.

In some embodiments providing the first reactant may further comprise forming a first intermediate product by reducing a Mo or W halide with a reducing agent, and forming a second intermediate product by subsequently adding a solvent to the first product, thereby forming the first reactant. In some embodiments the Mo or W halide is $MoCl_5$, the beta-diketone compound is Hthd, and the formed Mo or W beta-diketonate precursor is $Mo(thd)_3$.

In some aspects, methods for forming a Mo or W beta-diketonate compound are provided. According to some embodiments, a Mo or W beta-diketonate compound is formed by providing a first reactant having the formula $MX_3(R)n_3$, wherein n is a number from 0 to 4, M is Mo or W, X is a halide, and R is a solvent, forming a first product by reacting an alkali metal compound with a beta-diketonato compound, and subsequently reacting the first product with the first reactant. In some embodiments a Mo or W beta-diketonate compound is formed having the formula $ML_3$, wherein M is Mo or W having an oxidation state of +III and L is a beta-diketonato ligand. In some embodiments the Mo or W in the Mo or W beta-diketonate compound has an oxidation state of +III.

In some aspects, processes for forming a Mo or W containing material are provided. According to some embodiments, a Mo or W containing material is formed on a substrate in a reaction chamber by a process comprising at least one deposition cycle, the cycle comprising alternately and sequentially contacting the substrate with a vapor phase Mo or W precursor and a second vapor phase chalcogen precursor. In some embodiments the Mo or W in the Mo or W precursor has an oxidation state less than or equal to +IV, but not 0.

In some embodiments the deposition is repeated two or more times. In some embodiments excess Mo or W precursor and reaction byproducts, if any, are removed subsequent to contacting the substrate with a vapor phase Mo or W precursor and prior to contacting the substrate with the vapor phase chalcogen precursor. In some embodiments excess chalcogen precursor and reaction byproducts, if any, are removed subsequent to contacting the substrate with a vapor phase chalcogen precursor and prior to beginning another deposition cycle. In some embodiments the substrate is contacted with a purge gas subsequent to contacting the substrate with the Mo or W vapor phase precursor and prior to contacting the substrate with the vapor phase chalcogen precursor. In some embodiments the substrate is contacted with a purge gas subsequent to contacting the substrate with the chalcogen vapor phase precursor and prior to beginning another deposition cycle. In some embodiments the Mo or W containing material comprises elemental Mo or W. In some embodiments the Mo or W containing material comprises a Mo or W oxide material. In some embodiments the Mo or W containing material comprises a Mo or W nitride material. In some embodiments the Mo or W containing material comprises a Mo or W silicide material.

BRIEF DESCRIPTION OF THE DRAWINGS

The invention will be better understood from the Detailed Description and from the appended drawings, which are meant to illustrate and not to limit the invention, and wherein.

DETAILED DESCRIPTION

Figure 1:
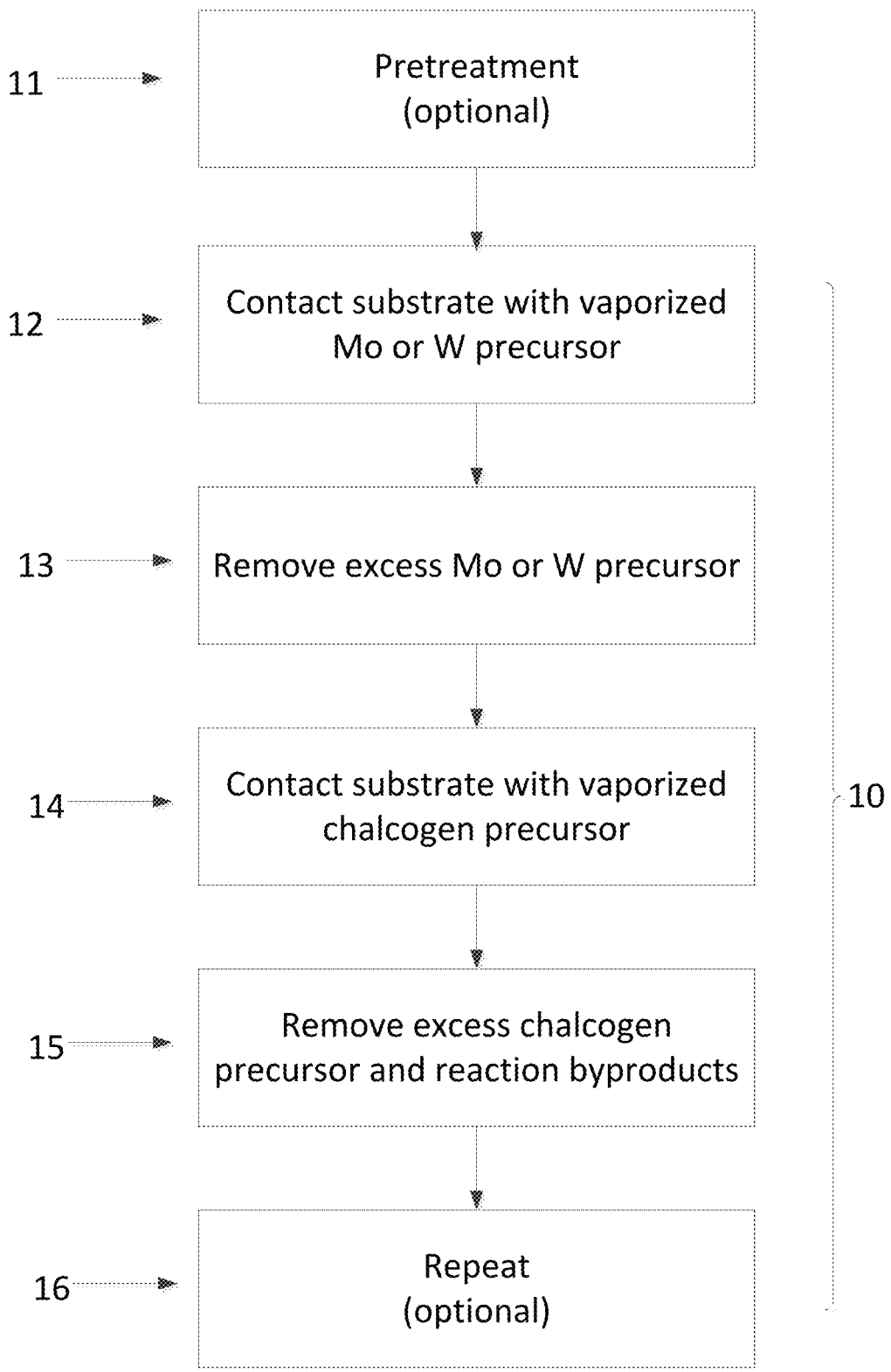
FIG. 1 is a process flow diagram generally illustrating a method for depositing a Mo or W containing thin film.

As discussed below, Mo and W containing thin films can be deposited on a substrate by atomic layer deposition (ALD) type processes. In some embodiments Mo or W chalcogenide thin films, particularly Mo or W sulfide or selenide thin films can be deposited on a substrate by ALD type processes. ALD type processes are based on controlled surface reactions of precursor chemicals. Gas phase reactions are avoided by alternately and sequentially contacting the substrate with the precursors. Vapor phase reactants are separated from each other on the substrate surface, for example, by removing excess reactants and/or reactant byproducts from the reaction chamber between reactant pulses.

Suitable substrate materials may include insulating materials, dielectric materials, crystalline materials, epitaxial, heteroepitaxial, or single crystal materials such as oxides. For example, the substrate may comprise $Al_2O_3$, sapphire, silicon oxide, or an insulating nitride, such as AlN. Further, the substrate material and/or substrate surface may be selected by the skilled artisan to enhance, increase, or maximize two-dimensional crystal growth thereon. In some embodiments the substrate surface on which the Mo and W containing thin film or material is to be deposited does not comprise semiconductor materials, such as Si, Ge, III-V compounds, for example GaAs and InGaAs, or II-VI compounds. In some embodiments the substrate surface on which the Mo and W containing thin film or material is to be deposited may also comprise materials other than insulating materials. In some embodiments, after deposition of the Mo or W containing thin film, the Mo and W containing thin film is removed from at least a portion of the substrate comprising a material other than an insulating material. In some embodiments the substrate surface on which the Mo and W containing thin film or material, preferably a Mo or W chalcogenide thin film or material, is to be deposited comprises a chalcogen, such as sulfur, selenium or tellurium, most preferably sulfur. In some embodiments the substrate surface on which the Mo and W containing thin film or material is to be deposited comprises surface groups which comprise a chalcogen, preferably surface groups having chalcogen-hydrogen bonds, such as a —S—H group.

Briefly, a substrate is heated to a suitable deposition temperature, generally at lowered pressure. Deposition temperatures are generally maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature varies depending on the type of film being deposited and particular precursors, but is preferably at or below about 650° C.; more preferably at or below about 500° C. The temperature window is preferably from about 250° C. to about 600° C., more preferably from about 350° C. to about 550°. and most preferably from about 375° C. to about 500° C. In some instances the reaction temperature is above about 250° C., preferably above about 350° C. and most preferably above about 375° C.

In some embodiments the deposition temperature may be above the decomposition temperature of a reactant, but still low enough to maintain reasonably surface controlled growth of a film and a growth rate which is less than or equal to about a monolayer of material per deposition cycle. In some embodiments a deposition cycle growth rate may be less than or equal to about 50%, preferably less than about 25%, and more preferably less than about 10% of about a monolayer of material being deposited per cycle.

In some embodiments a deposition process may not be a pure ALD process. In some embodiments a chalcogen precursor may flow continuously or substantially continuously through a reaction space throughout a deposition process. For example, the flow rate of a chalcogen precursor through a reaction space may be reduced while the substrate is contacted with a metal precursor. In some embodiments where a chalcogen precursor may flow continuously, the growth rate of the film per pulse of metal precursor is less than or equal to about one monolayer of the material being deposited. In some embodiments where the chalcogen precursor flows continuously, the growth rate per pulse of metal precursor is less than or equal to about 50%, preferably less than about 25%, and more preferably less than about 10% of a monolayer of the material being deposited.

In some embodiments the growth rate of the Mo and W containing thin films is less than about 2 Å/cycle, less than about 1.5 Å/cycle, less than about 1 Å/cycle or even less than about 0.5 Å/cycle. In some embodiments the growth rate of a Mo and W containing dichalcogenide thin film may be from about 0.025 Å/cycle to about 0.5 Å/cycle. In other embodiments the growth rate of a Mo and W containing dichalcogenide thin film, for example a $MoS_2$ thin film, is from about 0.05 Å/cycle to about 0.3 Å/cycle.

In some embodiments, a substrate surface may be subjected to a pretreatment process. In some embodiments, a pretreatment process comprises exposing the substrate to a pretreatment reactant either in situ or ex situ prior to depositing a Mo or W containing thin film. In some embodiments a pretreatment process may comprise exposing the substrate surface to at least one of the following pretreatment reactants: $(NH_4)_2S$, $H_2S$, HCl, HBr, $Cl_2$, and HF. In some embodiments a pretreatment process may comprise exposing the substrate surface to a plasma, atoms, or radicals. In some embodiments a pretreatment process may comprise exposing the substrate surface to a plasma, atoms, or radicals comprising a chalcogen, such as a plasma, atoms, or radicals comprising sulfur, selenium or tellurium, preferably sulfur. In some embodiments the plasma, atoms, or radicals may comprise tellurium. In some embodiments the plasma, atoms, or radicals may comprise selenium. In some embodiments a pretreatment process may comprise exposing the substrate surface to a plasma, atoms, or radicals comprising a chalcogen which is present in a subsequent deposition process. In some embodiments a pretreatment process may comprise exposing the substrate surface to a plasma, atoms, or radicals formed from a chalcogen compound comprising a chalcogen-hydrogen bond, such as a plasma, atoms, or radicals formed from $H_2S$. In some embodiments a pretreatment process may comprise exposing the substrate surface to at least one pretreatment reactant for a period of between about 1 second and about 600 seconds, preferably between about 1 second and about 60 seconds. A pretreatment process may utilize pretreatment reactants in vapor form and or in liquid form. In some embodiments, the pretreatment process may be carried out at the same temperature and/or pressure as the subsequent deposition process. In some embodiments, the pretreatment process may resemble the subsequent deposition process except that the pretreatment process will involve a longer pulse time or exposure time than used in the subsequent deposition process. In some embodiments a pretreatment process may comprise exposing the substrate surface to a pretreatment reactant to form desired surface terminations, such as —S—H surface terminations. In some embodiments forming desired surface terminations, for example —S—H surface terminations may promote two-dimensional growth of a Mo or W containing thin film or material. In some embodiments a pretreatment process may comprise exposing the substrate to a plasma, atoms, or radicals that do not comprise S, Se, or Te, for example a plasma, atoms, or radicals comprising hydrogen, for example a plasma formed from $H_2$. In some embodiments a pretreatment process may comprise exposing the substrate to an oxygen plasma, oxygen atoms, or oxygen radicals. In some embodiments a pretreatment process may comprise exposing the substrate, for example a substrate comprising AlN, to a nitrogen plasma, nitrogen atoms, or nitrogen radicals. In some embodiments a pretreatment process may be used to clean a substrate surface prior to deposition of a Mo or W containing thin film or material.

The surface of the substrate is contacted with a vapor phase first reactant. In some embodiments a pulse of vapor phase first reactant is provided to a reaction space containing the substrate. In some embodiments the substrate is moved to a reaction space containing vapor phase first reactant. Conditions are preferably selected such that no more than about one monolayer of the first reactant is adsorbed on the substrate surface in a self-limiting manner. The appropriate contacting times can be readily determined by the skilled artisan based on the particular circumstances. Excess first reactant and reaction byproducts, if any, are removed from the substrate surface, such as by purging with an inert gas or by removing the substrate from the presence of the first reactant.

Purging means that vapor phase precursors and/or vapor phase byproducts are removed from the substrate surface such as by evacuating a chamber with a vacuum pump and/or by replacing the gas inside a reactor with an inert gas such as argon or nitrogen. Typical purging times are from about 0.05 to 20 seconds, more preferably between about 0.2 and 10, and still more preferably between about 0.5 and 5 seconds. However, other purge times can be utilized if necessary, such as where highly conformal step coverage over extremely high aspect ratio structures or other structures with complex surface morphology is needed, or where different reactor types may be used, such as a batch reactor.

The surface of the substrate is contacted with a vapor phase second gaseous reactant. In some embodiments a pulse of a second gaseous reactant is provided to a reaction space containing the substrate. The vapor phase second gaseous reactant may be provided into the reaction chamber in a substantially continuous flow from a reaction chamber inlet to an outlet. In some embodiments outlet flow from the reaction chamber, for example a pump line, is not closed. In some embodiments outlet flow from the reaction chamber, for example flow from a reaction chamber to a pump line and further through the pump line prior to the pump, is not substantially closed, but may be restricted. In some embodiments the substrate is moved to a reaction space containing the vapor phase second reactant. Excess second reactant and gaseous byproducts of the surface reaction, if any, are removed from the substrate surface. In some embodiments there is no dwell time for the reactants. In some embodiments a vapor phase reactant is not static in the reaction space while the vapor phase reactant is contacting the substrate. A vapor phase reactant may be static when the reactant is not experiencing flow relative to the substrate, or when the reactant is flowing into the reaction space from one inlet, with no open outlet.

The steps of contacting and removing are repeated until a thin film of the desired thickness has been selectively formed on the substrate, with each cycle leaving no more than about a molecular monolayer. The steps of contacting and removing a first vapor phase Mo or W precursor may be referred to as a first precursor phase, a Mo or W precursor phase, or a Mo or W phase. The steps of contacting and removing a second vapor phase precursor may be referred to as a second precursor phase, a chalcogen precursor phase, or a chalcogen phase. Together, these two phases can make up a deposition cycle. Additional phases comprising alternately and sequentially contacting the surface of a substrate with other reactants can be included to form more complicated materials, such as ternary materials.

As mentioned above, each phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage and uniformity. Typically, less than one molecular layer of material is deposited with each cycle, however, in some embodiments more than one molecular layer is deposited during the cycle.

Removing excess reactants can include evacuating some of the contents of a reaction space and/or purging a reaction space with helium, nitrogen or another inert gas. In some embodiments purging can comprise turning off the flow of the reactive gas while continuing to flow an inert carrier gas to the reaction space.

The precursors employed in the ALD type processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically contacting times are from about 0.05 to 20 seconds, more preferably between about 0.2 and 10, and still more preferably between about 0.5 and 5 seconds. In some embodiments the vapor phase second gaseous contacting time is preferably of the same order of magnitude as the vapor phase first gaseous reactant contacting time. In some embodiments the vapor phase second gaseous contacting time is preferably no more than about 100 times longer than the vapor phase first gaseous reactant contacting time.

However, depending on the substrate type and its surface area, the contacting time may be even higher than 20 seconds. Contacting times can be on the order of minutes in some cases. The optimum contacting time can be determined by the skilled artisan based on the particular circumstances. In some embodiments the chalcogen precursor contacting time is less than about 60 seconds, preferably less than about 30 seconds, more preferably less than about 10 seconds and most preferably less than about 5 seconds.

The mass flow rate of the precursors can also be determined by the skilled artisan. In some embodiments the flow rate of a Mo or W precursor is preferably between about 1 and 1000 sccm without limitation, more preferably between about 100 and 500 sccm.

The pressure in a reaction chamber is typically from about 0.01 to about 50 mbar, more preferably from about 0.1 to about 10 mbar. However, in some cases the pressure will be higher or lower than this range, as can be determined by the skilled artisan given the particular circumstances.

Before starting the deposition of the film, the substrate is typically heated to a suitable growth temperature. The growth temperature varies depending on the type of thin film formed, physical properties of the precursors, etc. The growth temperature is preferably at or below about 650° C.; more preferably at or below about 500° C. The growth temperature window is preferably from about 250° C. to about 600° C., more preferably from about 350° C. to about 550° C. and most preferably from about 375° C. to about 500° C. In some instances the growth temperature is above about 250° C., preferably above about 350° C. and most preferably above about 375° C. The growth temperature can be less than the crystallization temperature for the deposited materials such that an amorphous thin film is formed or it can be above the crystallization temperature such that a crystalline thin film is formed. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan. It is to be noted that the thermal budget, that is a(reaction temperature and optionally an anneal temperature, during deposition and at any point in further processing after the deposition for films of the present invention is preferably be less than about 800° C., more preferably less than about 650° C. and most preferably less than about 600° C. and in some instances less than about 500° C.

In some embodiments the deposited Mo or W containing thin film may be subjected to optional post deposition treatment process. In some embodiments, for example, a post deposition treatment process may comprise an annealing process, for example a forming gas annealing process. In some embodiments a post deposition treatment process may comprise exposing the Mo or W containing thin film or material surface to a plasma In some other embodiments a post deposition treatment process does not comprise exposing the Mo or W containing thin film or material surface to a plasma.

In some embodiments, a post deposition treatment process may comprise exposing the deposited Mo or W containing thin film or material to a post deposition treatment reactant either in situ or ex situ. In some embodiments a post deposition treatment process may comprise exposing the Mo or W containing thin film or material surface to at least one of the following post deposition treatment reactants: $(NH_4)_2S$ or $H_2S$. In some embodiments a post deposition treatment process may comprise exposing the Mo or W containing thin film or material to a plasma comprising a chalcogen, such as a plasma comprising sulfur. In some embodiments a post deposition treatment process may comprise exposing the Mo or W containing thin film or material to a plasma formed from a chalcogen compound comprising a chalcogen-hydrogen bond, such as plasma formed from $H_2S$. In some embodiments a post deposition treatment process may comprise exposing the Mo or W containing thin film or material to a plasma comprising a chalcogen, such as a plasma comprising sulfur. In some embodiments a post deposition treatment process may comprise exposing the Mo or W containing thin film or material to at least one post deposition treatment reactant for a period of between about 1 second and about 600 seconds, preferably between about 1 second and about 60 seconds. A post deposition treatment process may utilize post deposition treatment reactants in vapor form and or in liquid form. In some embodiments, a post deposition treatment process may be carried out at about the same temperature and/or pressure as a preceding deposition process. In some embodiments, a post deposition treatment process may resemble a preceding deposition process except that the post deposition treatment process may involve a longer pulse time or exposure time than used in a preceding deposition process. In some embodiments a post deposition treatment process may comprise exposing the Mo or W containing thin film or material to a plasma, atoms, or radicals comprising hydrogen, for example a plasma formed from $H_2$.

Examples of suitable reactors that may be used include commercially available ALD equipment such as the F-120® reactor, Eagle® XP8, Pulsar® reactor and Advance® 400 Series reactor, available from ASM America, Inc. of Phoenix, Ariz., ASM Japan KK, Tokyo, Japan and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used. Preferably, reactants are kept separate until reaching the reaction chamber, such that shared lines for the precursors are minimized. However, other arrangements are possible, such as the use of a pre-reaction chamber as described in U.S. patent application Ser. Nos. 10/929,348, filed Aug. 30, 2004 and 09/836,674, filed Apr. 16, 2001, the disclosures of which are incorporated herein by reference.

In some embodiments a suitable reactor may be a batch reactor and may contain more than about 25 substrates, more than about 50 substrates or more than about 100 substrates. In some embodiments a suitable reactor may be a mini-batch reactor and may contain from about 2 to about 20 substrates, from about 3 to about 15 substrates or from about 4 to about 10 substrates.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run.

A stand-alone reactor can be equipped with a load-lock. In that case, it is not necessary to cool down the reaction space between each run.

According to preferred embodiments, and illustrated in FIG. 1, a Mo or W containing thin film is formed on a substrate by an ALD type process comprising at least one deposition cycle 10 the deposition cycle comprising:

contacting the surface of a substrate with a vaporized Mo or W precursor at step 12 to form at most a molecular monolayer of the Mo or W precursor on the substrate;

removing excess Mo or W precursor and reaction by products, if any, from the surface at step 13;

contacting the surface of the substrate with a vaporized chalcogen precursor at step 14; and removing from the surface excess chalcogen precursor and any gaseous by-products formed in the reaction between the Mo or W precursor layer and the chalcogen precursor at step 15.

The contacting and removing steps can be repeated 16 until a Mo or W containing thin film of the desired thickness has been formed.

Although the illustrated deposition cycle begins with contacting the surface of the substrate with the Mo or W precursor, in other embodiments the deposition cycle begins with contacting the surface of the substrate with the chalcogen precursor. It will be understood by the skilled artisan that if the surface of the substrate is contacted with a first precursor and that precursor does not react then the process will begin when the next precursor is provided. In some embodiments, the reactants and reaction by-products can be removed from the substrate surface by stopping the flow of Mo or W precursor while continuing the flow of an inert carrier gas such as nitrogen or argon.

In some embodiments, the reactants and reaction by-products can be removed from the substrate surface by stopping the flow of second reactant while continuing the flow of an inert carrier gas. In some embodiments the substrate is moved such that different reactants alternately and sequentially contact the surface of the substrate in a desired sequence for a desired time. In some embodiments the removing steps are not performed. In some embodiments no reactant may be removed from the various parts of a chamber. In some embodiments the substrate is moved from a part of the chamber containing a first precursor to another part of the chamber containing the second precursor. In some embodiments the substrate is moved from a first reaction chamber to a second, different reaction chamber.

In some embodiments the deposited Mo or W containing films may comprise a dichalcogenide thin film. In some embodiments the deposited thin film may comprise a molybdenum dichalcogenide or tungsten dichalcogenide. In some embodiments the deposited thin film may comprise $MoS_2$, $WS_2$, $MoSe_2$, $WSe_2$, $MoTe_2$, or $WTe_2$. For simplicity, these dichalcogenides have been indicated to have these general stoichiometries. But it will be understood that the exact stoichiometry of any given Mo or W containing film or material will vary based on the oxidation state of the elements involved. Accordingly, other stoichiometries are expressly contemplated.

Although the term "dichalcogenide" is used herein and these dichalcogenides are indicated to have general stoichiometries with the ratio of metal atoms, such as Mo or W, to chalcogen atoms, such as S, Se, or Te, of 1:2, the stoichiometry of the films may vary. For example the ratio of metal atoms to chalcogen atoms may vary due to the analysis techniques used and/or the process conditions. In some embodiments the ratio of metal atoms to chalcogen atoms can be from about 1:3 to about 2:1, preferably from about 1:2.5 to about 1:1, and more preferably about to 1:2. In some embodiments the dichalcogenide film may contain from about 20 at-% to about 50 at-%, preferably from about 25 at-% to about 40 at-% of Mo or W. In some embodiments the dichalcogenide film may contain from about 30 at-% to about 75 at-%, preferably from about 35 at-% to about 70 at-% of a chalcogen (S, Se or Te).

In some embodiments the Mo or W containing dichalcogenide film may contain elements other than Mo, W, and chalcogens, preferably a total of less than about 35 at-% of elements, including hydrogen, other than Mo, W, and chalcogens, more preferably total of less than about 25 at-%. In some embodiments the film may contain less than about 20 at-% carbon, preferably less than about 15 at-% carbon, and most preferably less than about 10 at-% carbon. In some embodiments the film may contain less than about 15 at-% hydrogen, preferably less than about 10 at-% hydrogen, and most preferably less than about 5 at-% hydrogen. In some embodiments the film may contain less than about 10 at-% oxygen, preferably less than about 5 at-% oxygen, and most preferably less than about 3 at-% oxygen. In some embodiments the film may contain less than about 10 at-%, preferably less than about 5 at-% and most preferably less than about 3 at-% of elements other than Mo or W, chalcogens, hydrogen, carbon or oxygen. It is to be noted that a Mo or W containing film containing the above described elements may still be suitable for different applications, such as for a 2D-material.

In some embodiments the deposited Mo or W containing film, although described herein for simplicity as containing Mo or W, may comprise both Mo and W. In some embodiments the deposited Mo or W containing film may comprise additional elements other than Mo, W, chalcogens (S, Te or Se), oxygen, nitrogen or silicon. In some embodiments the deposited Mo or W containing film may comprise a dopant. In some embodiments the deposited Mo or W containing film may comprise two or more of the elements of the group of chalcogens (S, Te or Se), oxygen, nitrogen or silicon. In some embodiments the deposited Mo or W chalcogenide containing film may comprise two or more of the elements of the group of chalcogens (S, Te or Se). In some embodiments the thin films of the present disclosure can include any number of metals. According to some embodiments Mo or W containing films may include two or more metals. In some embodiments, additional deposition phases are added to one or more deposition cycles to incorporate an additional metal or metals into a Mo or W containing thin film. An additional metal phase or phases may follow the first metal phase or follow the chalcogen phase, or may follow both phases. In some embodiments two or more different metal precursors may be provided simultaneously in the same metal phase of a deposition cycle. In some embodiments metal precursors comprising different metals may be used in different deposition cycles. For example, a first metal precursor may be the only metal precursor used in one or more deposition cycles and a second metal precursor comprising a second, different metal, may be used in one or more other deposition cycles.

Referring again to FIG. 1, some embodiments may include an optional pretreatment process at step 11 applied to the substrate surface. A pretreatment process may comprise one or more steps. In the pretreatment, the substrate surface on which Mo or W containing thin film is to be deposited may be exposed to one or more pretreatment reactants and/or to specific conditions, such as temperature or pressure. A pretreatment may be used for any number of reasons including to clean the substrate surface, remove impurities, remove native oxide, and provide desirable surface terminations. In some embodiments, a pretreatment comprises exposing the substrate surface to one or more pretreatment reactant, such as $(NH_4)_2S$, $H_2S$, HCl, HBr, $Cl_2$, or HF. In some embodiments, a pretreatment process is carried out at about the same temperature as the subsequent deposition process.

As described below, a number of different precursors can be used to deposit Mo or W containing thin films. Preferably, the Mo or W precursor has a formula of M(thd)$_3$, wherein M is one of Mo or W and thd is 2,2,6,6-tetramethyl-3,5-heptanedionato. Preferably the chalcogen precursor is one of $H_2S$ or $H_2Se$. In a preferred embodiment the Mo or W precursor is Mo(thd)$_3$, the chalcogen precursor is $H_2S$, and the resultant Mo or W containing thin film is a MoS$_2$ thin film.

In some embodiments a MoS$_2$ thin film is formed on a substrate by an ALD type process comprising at least one deposition cycle comprising:

contacting the surface of a substrate with vaporized Mo(thd)$_3$ to form at most a molecular monolayer of Mo(thd)$_3$ on the substrate;

removing excess Mo(thd)$_3$ and reaction by products, if any, from the surface;

contacting the surface of the substrate with vaporized $H_2S$; and removing from the surface excess $H_2S$ and any gaseous by-products formed in the reaction between the Mo(thd)$_3$ layer and the $H_2S$.

The contacting and removing steps can be repeated until a MoS$_2$ thin film of the desired thickness has been formed.

In some embodiments a MoSe$_2$ thin film is formed on a substrate by an ALD type process comprising at least one deposition cycle comprising:

contacting the surface of a substrate with vaporized Mo(thd)$_3$ to form at most a molecular monolayer of Mo(thd)$_3$ on the substrate;

removing excess Mo(thd)$_3$ and reaction by products, if any, from the surface;

contacting the surface of the substrate with vaporized $H_2Se$; and removing from the surface excess $H_2Se$ and any gaseous by-products formed in the reaction between the Mo(thd)$_3$ layer and the $H_2Se$.

The contacting and removing steps can be repeated until a MoSe$_2$ thin film of the desired thickness has been formed.

In some embodiments a WS$_2$ thin film is formed on a substrate by an ALD type process comprising at least one deposition cycle comprising:

contacting the surface of a substrate with vaporized W(thd)$_3$ to form at most a molecular monolayer of W(thd)$_3$ on the substrate;

removing excess W(thd)$_3$ and reaction by products, if any, from the surface;

contacting the surface of the substrate with vaporized $H_2S$; and removing from the surface excess $H_2S$ and any gaseous by-products formed in the reaction between the W(thd)$_3$ layer and the $H_2S$.

The contacting and removing steps can be repeated until a WS$_2$ thin film of the desired thickness has been formed.

In some embodiments a WSe$_2$ thin film is formed on a substrate by an ALD type process comprising at least one deposition cycle comprising:

contacting the surface of a substrate with vaporized W(thd)$_3$ to form at most a molecular monolayer of W(thd)$_3$ on the substrate;

removing excess W(thd)$_3$ and reaction by products, if any, from the surface;

contacting the surface of the substrate with vaporized $H_2Se$; and removing from the surface excess $H_2Se$ and any gaseous by-products formed in the reaction between the W(thd)$_3$ layer and the $H_2Se$.

The contacting and removing steps can be repeated until a WSe$_2$ thin film of the desired thickness has been formed.

Mo or W Precursors

Any of the following precursors can be used in the various ALD processes disclosed herein. In some embodiments the Mo or W precursor is a metal-organic compound. In some embodiments the Mo or W precursor has at least one multidentate ligand. In some embodiments the Mo or W precursor have at least one bidentate ligand. In some embodiments the Mo or W precursor have three bidentate ligands and no other ligands. In some embodiments the Mo or W precursor have at least one multidentate ligand which are connected to Mo or W through O, N or S atoms, more preferably at least through one O atom. In some embodiments the Mo or W precursor may have at least one multidentate ligand which is connected to Mo or W through both O and N atoms. More preferably, beta-diketonate compounds are used. In some embodiments ketoiminate compounds are used. In some embodiments, M(acac)$_3$, M(thd)$_3$, M(tfac)$_3$, M(bac)$_3$, M(hfac)$_3$ or M(fod)$_3$ compounds are used, wherein M is Mo or W, acac is acetylacetonato or 2,4-pentanedionato, thd is 2,2,6,6-tetramethyl-3,5-heptanedionato, tfac is trifluoroacetylacetonato or 1,1,1-trifluoro-2,4-pentanedionato, bac is benzoylacetonato, $C_6H_5COCHCOCH_3$, or 1-Phenyl-1,3-butanedionato, hfac is hexafluoroacetylacetonato or 1,1,1,5,5,5-hexafluoro-2,4-pentanedionato and fod is 2,2-dimethyl-6,6,7,7,8,8,8-heptafluorooctane-3,5-dionato. In some embodiments the Mo or W precursor does not comprise a metal halide. In some embodiments the Mo or W precursor has more than one Mo or W atom. In some embodiments the Mo or W precursor has more than one Mo or W atom, wherein the more than one Mo or W atoms are bonded to each other. In some embodiments the metalorganic Mo or W precursor has at least one coordinated organic ligand and Mo or W bonded directly to oxygen, which is not bonded to any other element or compound. In some embodiments the Mo or W precursor may have at least one ligand which is connected to Mo or W through O, N or S atoms, preferably at least through one O atom.

In some embodiments the Mo or W precursor may be selected from the group consisting of Mo or W beta-diketonate compounds, Mo or W cyclopentadienyl compounds, Mo or W carbonyl compounds and combinations thereof. In some embodiments the Mo or W precursor does not comprise one or more halide ligands. In some embodiments the Mo or W precursor does not comprise one or more halide ligands which are bonded directly to Mo or W. In some embodiments the Mo or W precursor does comprise one or more halide ligands which are not bonded directly to Mo or W. In preferred embodiments, the Mo or W precursor is Mo(thd)$_3$ or W(thd)$_3$. In some embodiments, Mo or W precursor does not have carbonyl (CO) ligands. In some embodiments, Mo or W precursor does not have six carbonyl (CO) ligands. In some embodiments, Mo or W precursor does have one, two, three, four or five carbonyl (CO) ligands. In some embodiments, the Mo or W precursor is a beta-diketonate, but not Mo(thd)$_3$ or W(thd)$_3$.

Mo has several oxidation states, including +VI, +V, +IV, +III, +II, +I, 0, −I, and −II. W has several oxidation states, including +VI, +V, +IV, +III, +II, +I, 0, −I, and −II. In some embodiments the Mo or W in the Mo or W precursor has an oxidation state of +III, for example Mo has an oxidation state of +III in Mo(thd)$_3$. In some embodiments the Mo or W in the Mo or W precursor has an oxidation state of +II, for example in CpMo(CO)$_3$Cl, Me$_2$Mo(PMe$_3$)$_4$, CpW(CO)$_3$Cl, and Me$_2$W(PMe$_3$)$_4$. In some embodiments the Mo or W in the Mo or W precursor has an oxidation state of +I, for example Mo has an oxidation state of +I in Mo(hfac). In some embodiments the Mo or W in the resultant thin film has an oxidation state of +IV. In some embodiments the Mo or W from the Mo or W precursor is oxidized during the formation of the resultant thin film. In some embodiments it may be beneficial for the Mo or W in the Mo or W precursor to have an oxidation state of +IV, such as in Cp$_2$MoH$_2$, Mo(NMe$_2$)$_4$, Mo(S$^t$Bu)$_4$, and Mo(S$_2$CNMe$_2$)$_4$ or in Cp$_2$WH$_2$, W(NMe$_2$)$_4$, W(S$^t$Bu)$_4$, and W(S$_2$CNMe$_2$)$_4$.

A suitable or desirable oxidation state for the Mo or W in a Mo or W precursor may depend on particular conditions and circumstances, and the optimal oxidation state of the Mo or W in a Mo or W precursor given particular circumstances can be determined by the skilled artisan.

In some embodiments the Mo or W in the Mo or W precursor does not have an oxidation state greater than +III. In some embodiments the Mo or W in the Mo or W precursor does not have an oxidation state of +IV. In some embodiments the Mo or W in the Mo or W precursor has an oxidation state from +I to +III. In some embodiments the Mo or W in the Mo or W precursor does not have an oxidation state from +IV to +VI. In some embodiments the Mo or W in the Mo or W precursor does not have an oxidations state of +V. In some embodiments the Mo or W in the Mo or W precursor does not have an oxidation state of +VI. In some embodiments the Mo or W in the Mo or W precursor does not have an oxidation state of +II. In some embodiments the Mo or W in the Mo or W precursor has an oxidation state of +III. In some embodiments the Mo or W in the Mo or W precursor does not have an oxidation state of −II.

Therefore, in some embodiments the Mo or W in the Mo or W precursor may comprise an oxidation state from +I to +III, and may be oxidized during the formation of the resultant thin film, whereupon the Mo or W has an oxidation state of +IV.

Without wishing to be bound to any one particular theory, it is believed that the closer the oxidation state of the metal of the precursor is to the oxidation state of the metal of the deposited film, the less energy and/or time is needed for the deposition of a film of a desired phase, crystal structure, crystallinity, or orientation. Further, it is believed that if the metal of the precursor has a lower oxidation state relative to the oxidation state of metal of the deposited film then less energy or time may be needed to deposit a film of a desired phase, crystal structure, crystallinity, or orientation. For example, where the metal of the deposited film has an oxidation state of +IV, it may be desirable for the metal of the precursor to have an oxidation state less than +IV, such as +III, and therefore, unlike in typical ALD processes, undergo oxidation during the deposition of the film.

In some embodiments the Mo or W precursor comprises at least one ligand that bonds to the Mo or W through two atoms, referred to herein as a bidentate ligand. In some embodiments the Mo or W precursor comprises at least one bidentate ligand that bonds to the Mo or W through at least an O, N, or S atom. In some embodiments the Mo or W precursor comprises at least one bidentate ligand that bonds to the Mo or W through an O atom at a first site and a second O atom at a second site. In some embodiments the Mo or W precursor comprises at least one bidentate ligand that bonds to the Mo or W through an O atom at a first site and an N atom at a second site. In some embodiments the Mo or W precursor comprises at least one bidentate ligand wherein the ligand bonds to the Mo or W through an N atom at a first site and a second N atom at a second site. In some embodiments the Mo or W precursor comprises at least two bidentate ligands. In some embodiments the Mo or W precursor comprises three bidentate ligands.

In some embodiments the Mo or W precursor comprises at least one bidentate ligand that is a beta-diketonato ligand. In some embodiments the at least one bidentate ligand is an acac ligand. In some embodiments the at least one bidentate ligand is a thd ligand. In some embodiments the Mo or W precursor may comprise at least two beta-diketonato ligands. In some embodiments the Mo or W precursor may comprise three beta-diketonato ligands. In some embodiments the Mo or W precursor may comprise at least two thd ligands. In some embodiments the Mo or W precursor may comprise at least two acac ligands. In some embodiments the Mo or W precursor may comprise three thd ligands. In some embodiments the Mo or W precursor may comprise three acac ligands.

In some embodiments the Mo or W precursor is vaporized without solvent. In preferred embodiments the Mo or W precursor is not mixed with solvent, such as organic solvent.

In some embodiments Mo or W beta-diketonates may be used in ALD type processes to deposit any kind of Mo or W containing thin film. In some embodiments Mo or W beta-diketonates may be used to deposit elemental Mo or W films, Mo or W oxide films, Mo or W nitride films, or Mo or W silicide films. In particular, $Mo(thd)_3$ and $W(thd)_3$ may be used in ALD type processes to deposit any kind of Mo or W containing thin film.

In some embodiments an elemental Mo or W thin film may be formed on a substrate by an ALD type process comprising at least one deposition cycle comprising:

contacting the surface of a substrate with vaporized Mo or W beta-diketonate precursor to form at most a molecular monolayer of Mo or W beta-diketonate precursor on the substrate;

removing excess Mo or W beta-diketonate precursor and reaction by products, if any, from the surface;

contacting the surface of the substrate with a second reactant, such as $H_2$, or hydrogen plasma, radicals, or atoms; and removing from the surface excess second reactant and any gaseous by-products formed in the reaction between the Mo or W beta-diketonate precursor layer and the second reactant.

The contacting and removing steps can be repeated until an elemental Mo or W thin film of the desired thickness has been formed.

In some embodiments a Mo or W oxide thin film may be formed on a substrate by an ALD type process comprising at least one deposition cycle comprising:

contacting the surface of a substrate with vaporized Mo or W beta-diketonate precursor to form at most a molecular monolayer of Mo or W beta-diketonate precursor on the substrate;

removing excess Mo or W beta-diketonate precursor and reaction by products, if any, from the surface;

contacting the surface of the substrate with an oxygen precursor, such as water, ozone, or oxygen plasma, radicals, or atoms; and removing from the surface excess oxygen precursor and any gaseous by-products formed in the reaction between the Mo or W beta-diketonate precursor layer and the oxygen precursor.

The contacting and removing steps can be repeated until a Mo or W oxide thin film of the desired thickness has been formed.

In some embodiments a Mo or W nitride thin film may be formed on a substrate by an ALD type process comprising at least one deposition cycle comprising:

contacting the surface of a substrate with vaporized Mo or W beta-diketonate precursor to form at most a molecular monolayer of Mo or W beta-diketonate precursor on the substrate;

removing excess Mo or W beta-diketonate precursor and reaction by products, if any, from the surface;

contacting the surface of the substrate with a precursor comprising nitrogen; and removing from the surface excess oxygen precursor and any gaseous by-products formed in the reaction between the Mo or W beta-diketonate precursor layer and the precursor comprising nitrogen.

The contacting and removing steps can be repeated until a Mo or W nitride thin film of the desired thickness has been formed.

In some embodiments a suitable precursor comprising nitrogen may include $NH_3$, In some embodiments a suitable precursor comprising nitrogen may include nitrogen containing plasmas, such as N-plasma, atoms, or radicals or N and H containing plasma, atoms, or radicals.

In some embodiments a Mo or W silicide thin film may be formed on a substrate by an ALD type process comprising at least one deposition cycle comprising:

contacting the surface of a substrate with vaporized Mo or W beta-diketonate precursor to form at most a molecular monolayer of Mo or W beta-diketonate precursor on the substrate;

removing excess Mo or W beta-diketonate precursor and reaction by products, if any, from the surface;

contacting the surface of the substrate with an precursor comprising silicon; and removing from the surface excess precursor comprising silicon and any gaseous by-products formed in the reaction between the Mo or W beta-diketonate precursor layer and the precursor comprising silicon.

The contacting and removing steps can be repeated until a Mo or W silicide thin film of the desired thickness has been formed.

In some embodiments a Mo or W containing material may be formed on a substrate by a process comprising at least one deposition cycle, the deposition cycle comprising alternately and sequentially contacting the substrate with a vapor phase Mo or W precursor and a second vapor phase chalcogen precursor. In some embodiments the deposition cycle may be repeated two or more times. In some embodiments the deposition cycle may be repeated two or more times sequentially. In some embodiments excess Mo or W precursor and reaction byproducts, if any, may be removed subsequent to contacting the substrate with a vapor phase Mo or W precursor and prior to contacting the substrate with the vapor phase chalcogen precursor. In some embodiments excess chalcogen precursor and reaction byproducts, if any, may be removed subsequent to contacting the substrate with a vapor phase chalcogen precursor and prior to beginning another deposition cycle. In some embodiments the substrate may be contacted with a purge gas subsequent to contacting the substrate with the Mo or W vapor phase precursor and prior to contacting the substrate with the vapor phase chalcogen precursor. In some embodiments the substrate may be contacted with a purge gas subsequent to contacting the substrate with the chalcogen vapor phase precursor prior to beginning another deposition cycle.

Synthesis of Mo or W Beta-Diketonate Precursors

Methods are also provided for making some of the Mo or W precursors used in the ALD processes described herein. In some embodiments precursors are synthesized having a formula of $M(L)_3$, wherein M is Mo or W and L is preferably a beta-diketonato ligand, most preferably acac, hfac, or thd. In some embodiments the Mo or W precursor that is synthesized has a formula of $M(thd)_3$, with M being Mo or W. In some embodiments the precursor that is synthesized is $Mo(thd)_3$ and in other embodiments it is $W(thd)_3$.

In some embodiments all handling and manipulation may be carried out in an atmosphere that does not comprise air, oxygen, or moisture. In some embodiments all handling and manipulation may be carried out in an inert gas atmosphere, for example a $N_2$ or Ar atmosphere.

Figure 2:
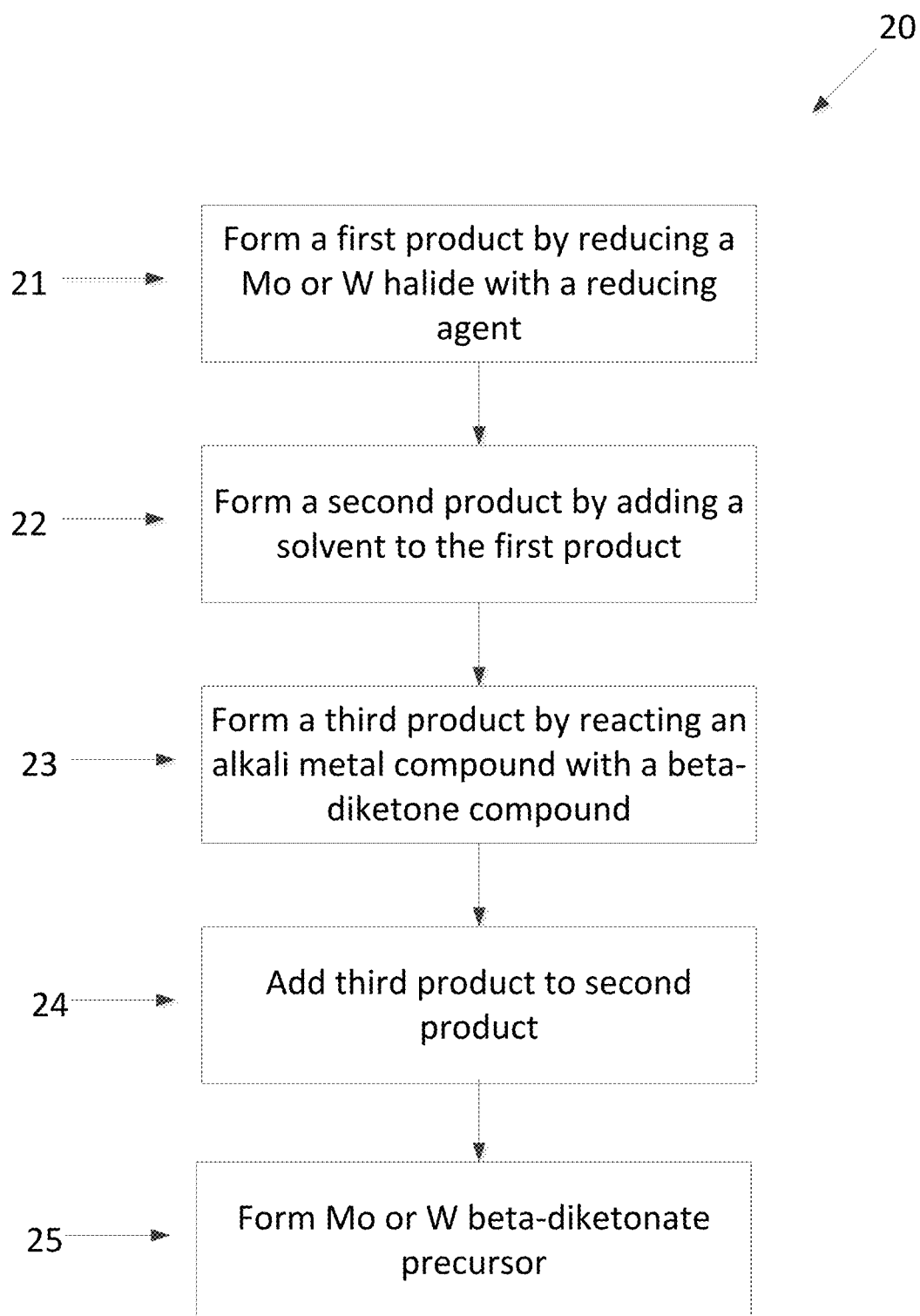
FIG. 2 is a process flow diagram generally illustrating a method for synthesizing a metal beta-diketonate precursor.

FIG. 2 is a process flow diagram generally illustrating methods for forming Mo or W beta-diketonate precursors 20. In some embodiments the process for making a Mo or W beta-diketonate precursor comprises:

forming a first product by reducing a Mo or W halide with a reducing agent at step 21;

forming a second product at step 22 by subsequently adding a solvent to the first product, thereby forming the second product $MX_3(R^1)_n$, n=0-4, wherein M is Mo or W, X is a halide, and $R^1$ is a solvent;

forming a third product at step 23 by reacting an alkali metal compound, for example BuLi, MeLi, NaH, or KH, with a beta-diketone; and subsequently adding the third product to the second product at step 24, thereby forming a Mo or W beta-diketonate precursor at step 25 having the formula $M(L)_3$, wherein M is Mo or W and L is a beta-diketonato ligand.

In some embodiments the Mo or W halide of step 21 is preferably an anhydrous Mo or W halide. In some embodiments the Mo or W halide of step 21 has the formula $MX_5$, wherein M is Mo or W and X is a halide, preferably Cl. In some embodiments the metal halide of step 21 may have the formula $MX_4$ or $MX_6$, wherein M is W and X is a halide. In some embodiments the Mo or W halide of step 21 is added to a solvent prior to reducing with the reducing agent, preferably an organic solvent, for example an ether. In preferred embodiments the solvent is $Et_2O$.

In some embodiments the reducing agent comprises a metal, such as metallic Sn. In some embodiments the reducing agent comprises organic species, preferably a bis(trialkylsilyl) six-membered ring system or a related compound, such as 1,4-bis(trimethylsilyl)-1,4-dihydropyrazine (DHP). Preferably the reducing agent is provided in a powder or pellet form, such as Sn pellets. In some embodiments reducing a Mo or W halide comprises adding a reducing agent to a solution comprising the Mo or W halide to thereby form a first product. In preferred embodiments reducing a Mo or W halide may comprise adding Sn pellets to a solution of $MCl_5$ in $Et_2O$ to thereby form $MCl_4(Et_2O)_2$, wherein M is Mo or W.

In some embodiments the mixture of a Mo or W halide and a reducing agent is stirred for a first duration. In some embodiments the mixture is stirred until completion of the reaction. After the desired first product comprising $MCl_4(Et_2O)_2$, wherein M is Mo or W, is formed the mixture may be allowed to settle. In some embodiments after the reaction is complete the first product may be separated and isolated from any solvents, by-products, excess reactants, or any other compounds that are not desired in the first product.

In some embodiments a solvent is added to the first product to thereby form a second product. In preferred embodiments the solvent is THF. In some embodiments the mixture is stirred for a second duration. In some embodiments the mixture is stirred until completion of the reaction. After the desired second product is formed the mixture may be allowed to settle. In some embodiments after the reaction is complete the second product may be separated and isolated from any solvents, by-products, excess reactants, or any other compounds that are not desired in the second product. In preferred embodiments forming the second product may comprise adding THF to the first product to thereby form $MCl_3(THF)_3$, wherein M is Mo or W.

In some embodiments the second product $MoCl_3(THF)_3$ is formed according to the methods disclosed in Stoffelbach et al. "Improved Preparations of Molybdenum Coordination Compounds from Tetrachlorobis(diethyl ether)molybdenum (IV)." Eur. J. Inorg. Chem. 10/2001: 2699-2703, which is hereby incorporated by reference in its entirety.

In some embodiments a third product is formed by reacting an alkali metal compound with a beta-diketone. In preferred embodiments the alkali metal compound comprises butyllithium. In some embodiments the alkali metal compound may comprise, for example KH, NaH, or MeLi. In some embodiments the alkali metal compound may be provided as a solution in an alkane, preferably hexane. In some embodiments the alkali metal compound may be added to a solvent. In some embodiments the solvent may comprise a heterocyclic solvent. In preferred embodiments the solvent is THF.

In some embodiments the beta-diketone compound may comprise Hthd; Hacac; Htfac, where Htfac is trifluoroacetylacetone; Hfod, where fod is 2,2-dimethyl-6,6,7,7,8,8,8-Heptafluoro-3,5-octanedione; or Hhfac; preferably Hthd. In some embodiments reacting an alkali metal compound with a beta-diketone compound may comprise adding the beta-diketone compound to the solution comprising the alkali metal compound to thereby form a third product having the formula $M^1L$, wherein $M^1$ is an alkali metal and L is a beta-diketonato ligand. In preferred embodiments butyllithium in hexane is added to THF to form a solution. Hthd is then added to the solution to react with the butyllithium and thereby form a third product comprising Lithd.

In some embodiments the solution is optionally cooled prior to, during, and/or after the reaction is complete. In some embodiments the beta-diketone compound may be cooled prior to the addition of the alkali metal compound. In some embodiments the solution may be stirred until the reaction is complete. In some embodiments any gaseous by-products produced by the reaction may be exhausted, for example through a bubbler.

In some embodiments the third product is added to the second product, thereby forming a Mo or W beta-diketonate precursor having the formula $ML_3$, wherein M is Mo or W and L is a beta-diketonato ligand. In some embodiments the second product may be added to a solvent prior to the addition of the third product. In preferred embodiments the solvent is THF. In some embodiments the third product is added to the mixture to thereby form a Mo or W beta-diketonate precursor. In some embodiments the third product may have the formula $M^1L$, wherein $M^1$ is an alkali metal and L is a beta-diketonato ligand. In some embodiments the third product may comprise a solution comprising the third product. In preferred embodiments Lithd is added to a suspension of $MCl_3(THF)_3$ in THF to thereby form $M(thd)_3$, wherein M is Mo or W.

In some embodiments the second product may be cooled prior to the addition of the third product. In some embodiments, after the addition of the third product, the mixture is allowed to warm to room temperature. In some embodiments the mixture is stirred for a second duration. In some embodiments the mixture is stirred until the reaction is complete.

After the reaction is substantially complete, the final product is separated and isolated from any solvents, by-products, excess reactants, or any other compounds that are not desired in the final product.

In some embodiments the process for making a Mo or W beta-diketonate precursor comprises:

forming a first product by reducing anhydrous $MoCl_5$ with Sn at step 21;

forming a second product $MoCl_3(THF)_3$ at step 22 by subsequently adding a solvent comprising tetrahydrofuran (THF) to the first product, thereby forming the second product $MoCl_3(THF)_3$;

forming a third product Lithd at step 23 by reacting butyllithium with Hthd; and subsequently adding the third product Lithd to the second product $MoCl_3(THF)_3$ at step 24, thereby forming the precursor $Mo(thd)_3$ at step 25.

Example 1

$Mo(thd)_3$ was synthesized by the following process. All handling and manipulation was done under the rigorous exclusion of air and moisture using standard Schlenk techniques and an inert gas ($N_2$ or Ar) glove box.

First, 5.00 g (18.3 mmol) of anhydrous $MoCl_5$ and 10 g (84 mmol) of Sn pellets were suspended in 50 ml of $Et_2O$. The mixture was stirred for 1 hour at room temperature to form a solution and solid. The solid was allowed to settle to the bottom of the Schlenk bottle and most of the $Et_2O$ solution was removed using Ar pressure and a Teflon capillary tube.

Then, 50 ml of THF was added and the mixture was stirred for 3 hours at room temperature to form solid $MoCl_3(THF)_3$. The $MoCl_3(THF)_3$ was separated from the excess Sn by transferring the THF/$MoCl_3(THF)_3$ suspension to another Schlenk bottle using Ar pressure and a Teflon capillary tube. The solid $MoCl_3(THF)_3$ was then filtered out of the suspension using a Schlenk sinter and washed with $Et_2O$.

Next a Lithd solution was prepared. 30 ml of THF was cooled with a $CO_2$/acetone bath and 4.48 ml of a solution of 1.6 BuLi in hexane was added. 1.321 g (7.168 mmol) of Hthd was then slowly added to the solution using a syringe. This solution was then stirred for 2 hours at room temperature. Gaseous by-products were allowed to exhaust from the Schlenk bottle containing the solution through a mercury bubbler.

The solid $MoCl_3(THF)_3$ was then suspended in 20 ml of THF. This suspension was then cooled with a $CO_2$/acetone bath and the previously prepared Lithd solution was added using a Teflon capillary and Ar pressure. The resultant solution was allowed to warm to room temperature and was stirred overnight.

THF solvent was then evaporated away using a water bath and vacuum. The resulting solid product was transferred into a sublimator and sublimed at 160° C.-180° C. and 0.5 mbar. The resulting $Mo(thd)_3$ sublimate was collected in the glove box.

Figure 3:
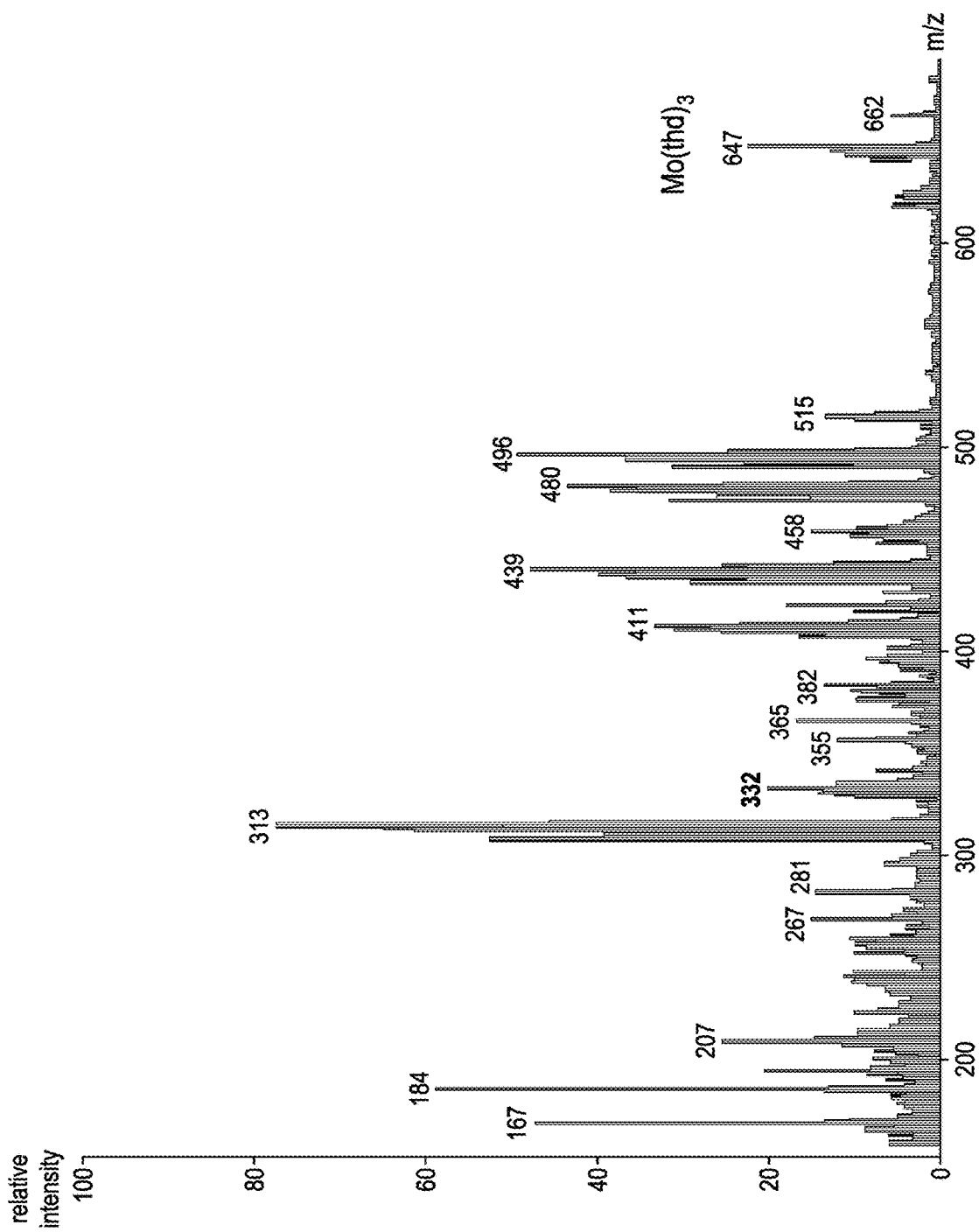
FIG. 3 is a mass spectrum of a sample of $Mo(thd)_3$ synthesized according to procedures described herein.

The synthesized compound was analyzed using mass spectrometry. As shown in FIG. 3, a molecular ion with an isotopic pattern corresponding to $Mo(thd)_3$ is seen at m/z 647. In addition to $Mo(thd)_3$, several peaks corresponding to fragment ions with oxygen, such as $[Mo(thd)_2O_2]^+$, $[Mo(thd)O]^+$, $[Mo(thd)_2O_2-Bu]^+$, and $[Mo(thd)O_2]^+$, can be seen. However, these peaks are likely due to exposure of the $Mo(thd)_3$ compound to air during sample loading into the mass spectrometer.

Figure 4:
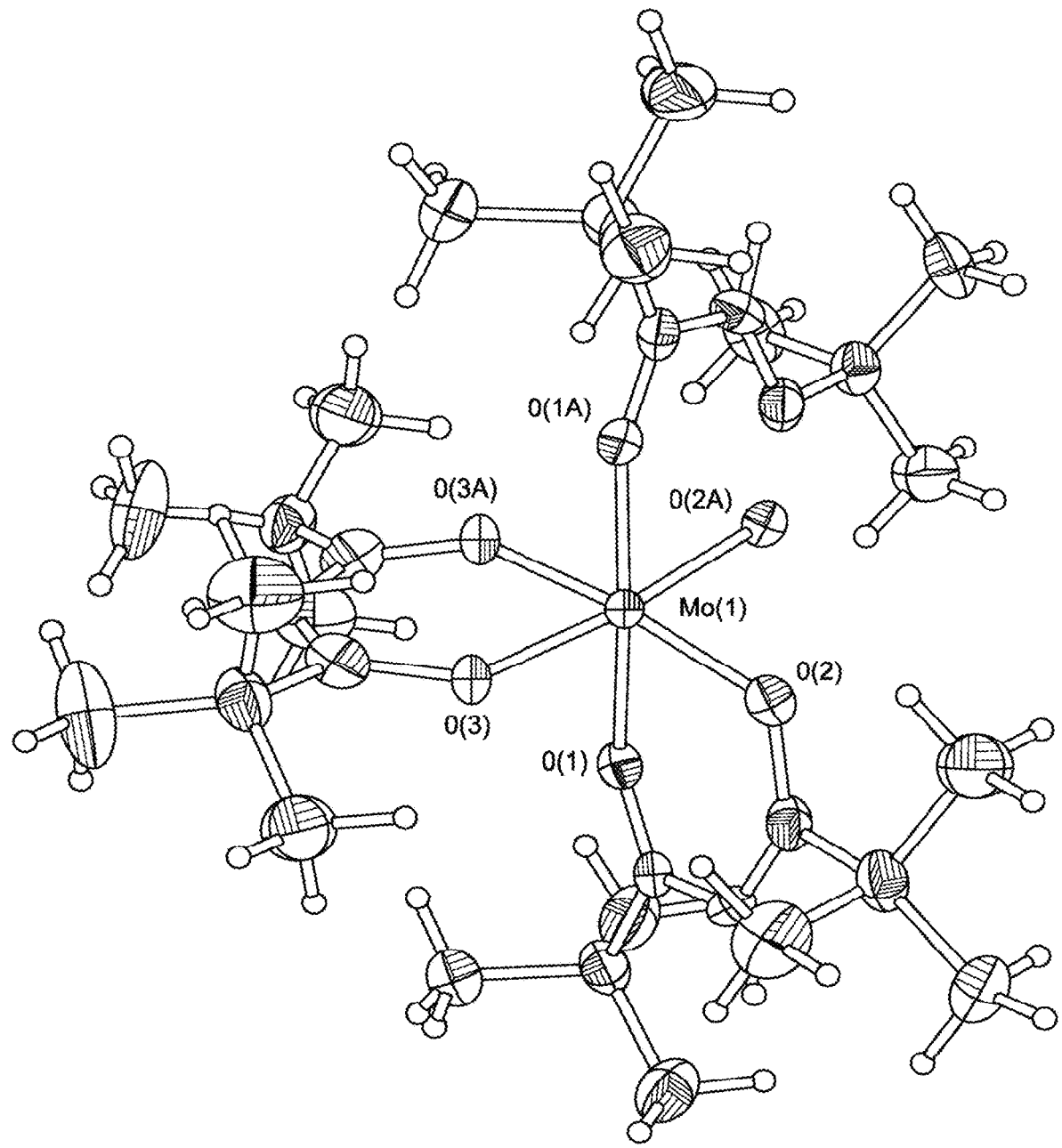
FIG. 4 illustrates the molecular structure of a $Mo(thd)_3$ as determined by single crystal x-ray diffraction.

The molecular structure of the synthesized compound was analyzed using single crystal x-ray diffraction (SCXRD). The structure of the synthesized $Mo(thd)_3$ compound is illustrated in FIG. 4.

Figure 5:
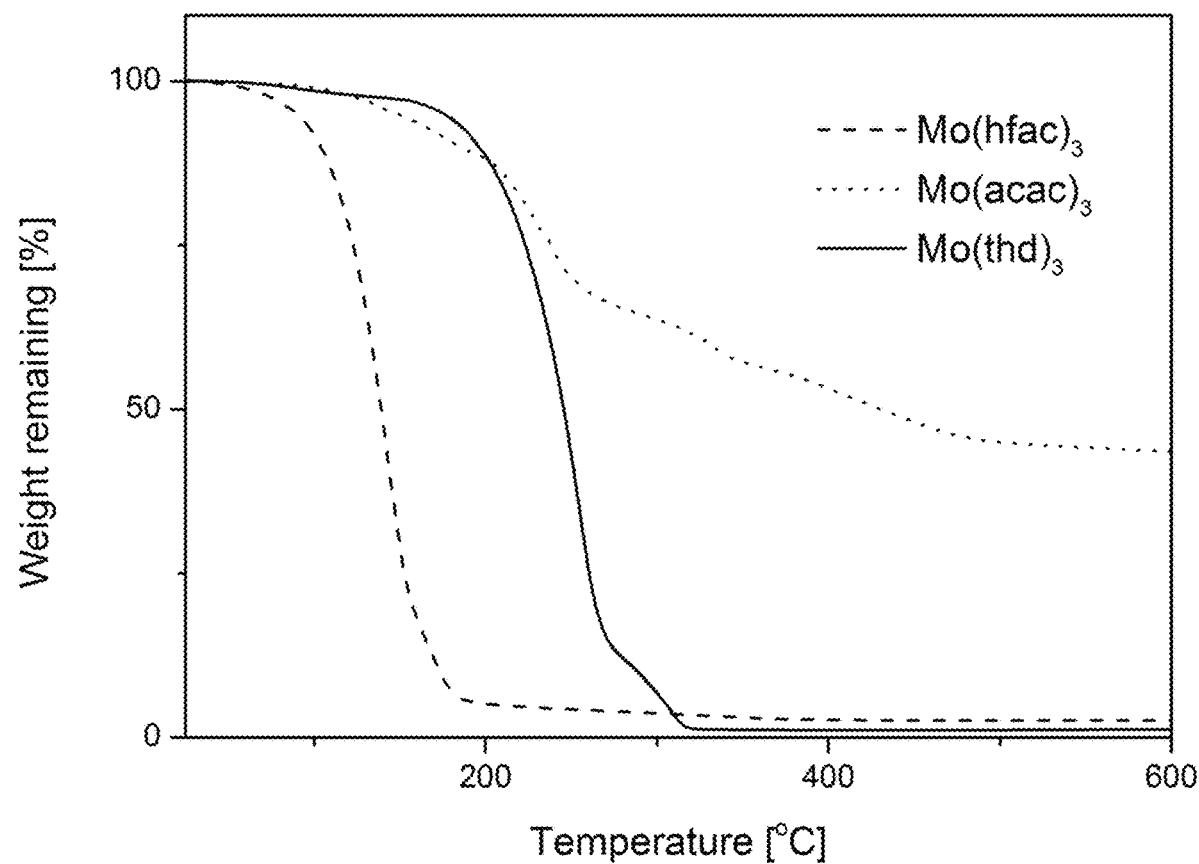
FIG. 5 illustrates thermogravimetric curves for $Mo(acac)_3$, $Mo(hfac)_3$, and $Mo(thd)_3$.

$Mo(acac)_3$ and $Mo(hfac)_3$ were also synthesized using procedures analogous to the procedure used to synthesize $Mo(thd)_3$. Hacac and Hhfac were used in place of Hthd to synthesize $Mo(acac)_3$ and $Mo(hfac)_3$ respectively. The thermal properties of the three Mo beta-diketonate compounds were investigated using thermogravimetric analysis (TGA). As shown in FIG. 5, the thermogravimetric curves for $Mo(thd)_3$ and $Mo(hfac)_3$ show the evaporation of the compounds as the temperature increases, while the thermogravimetric curve for Mo(acac)3 is indicates that the compound primarily decomposed as the temperature increased.

Chalcogen Precursors

It will be understood by one skilled in the art that any number of chalcogen precursors may be used in the ALD processes disclosed herein. In some embodiments, a chalcogen precursor is selected from the following list: $H_2S$, $H_2Se$, $H_2Te$, $(CH_3)_2S$, $(NH_4)_2S$, dimethylsulfoxide $((CH_3)_2SO)$, $(CH_3)_2Se$, $(CH_3)_2Te$, elemental or atomic S, Se, Te, other precursors containing chalcogen-hydrogen bonds, such as $H_2S_2$, $H_2Se_2$, $H_2Te_2$, or chalcogenols with the formula R—Y—H, wherein R can be a substituted or unsubstituted hydrocarbon, preferably a $C_1$-$C_8$ alkyl or substituted alkyl, such as an alkylsilyl group, more preferably a linear or branched $C_1$-$C_5$ alkyl group, and Y can be S, Se, or Te. In some embodiments a chalcogen precursor is a thiol with the formula R—S—H, wherein R can be substituted or unsubstituted hydrocarbon, preferably $C_1$-$C_8$ alkyl group, more linear or branched preferably $C_1$-$C_5$ alkyl group. In some embodiments a chalcogen precursor has the formula $(R_3Si)_2Y$, wherein $R_3Si$ is an alkylsilyl group and Y can be Se or Te. In some embodiments, a chalcogen precursor comprises S or Se. In some preferred embodiments, a chalcogen precursor comprises S. In some embodiments the chalcogen precursor may comprise an elemental chalcogen, such as elemental sulfur. In some embodiments, a chalcogen precursor does not comprises Te. In some embodiments, a chalcogen precursor does comprise Se. In some embodiments, a chalcogen precursor is selected from precursors comprising S, Se or Te. In some embodiments, a chalcogen precursor comprises $H_2S_n$, wherein n is from 4 to 10.

Suitable chalcogen precursors may include any number of chalcogen-containing compounds so long as they include at least one chalcogen-hydrogen bond. In some embodiments the chalcogen precursor may comprise a chalcogen plasma, chalcogen atoms or chalcogen radicals. In some embodiments where an energized chalcogen precursor is desired, a plasma may be generated in the reaction chamber or upstream of the reaction chamber. In some embodiments the chalcogen precursor does not comprise an energized chalcogen precursor, such as plasma, atoms or radicals. In some embodiments the chalcogen precursor may comprise a chalcogen plasma, chalcogen atoms or chalcogen radicals formed from a chalcogen precursor comprising a chalcogen-hydrogen bond, such as $H_2S$. In some embodiments a chalcogen precursor may comprise a chalcogen plasma, chalcogen atoms or chalcogen radicals such as a plasma comprising sulfur, selenium or tellurium, preferably a plasma comprising sulfur. In some embodiments the plasma, atoms or radicals comprise tellurium. In some embodiments the plasma, atoms or radicals comprise selenium.

Example 2

$MoCl_5$ and $H_2S$ were used as precursors and various deposition experiments were performed at reaction temperatures of between 150° C. and 500° C. in a flow-type reactor (ASM America F-120 reactor) without a precursor dwell time. Various substrates were used: $Al_2O_3$, ZnS, Soda lime glass, Si, and Ir. After the deposition experiments were carried out, Mo or S were not detected on the substrates in amounts which would indicate film growth. EDX was conducted on the samples and only showed trace amounts of Mo. No S was detected on the samples. This process has been reported in Browning et al "Atomic layer deposition of $MoS_2$ thin films" which is hereby incorporate by reference in its entirety. Similar experiments in reasonably similar conditions were conducted by the present inventors regarding the process conditions as described in the paper by Browning, but the tests were unsuccessful, possibly indicating non-robustness of the processes disclosed therein.

Example 3

$MoS_2$ thin films were deposited according to ALD processes disclosed herein, utilizing $Mo(thd)_3$ as a Mo precursor and $H_2S$ as a chalcogen precursor. $MoS_2$ was deposited on silicon, titanium disulfide, alumina, and soda-lime glass substrates. The substrates were contacted with alternating pulses of $Mo(thd)_3$ and $H_2S$ at deposition temperatures ranging from about 175° C. to about 500° C.

No deposition of $MoS_2$ was observed at deposition temperatures from 175° C. to 350° C. The amount of film on the substrates appeared to increase with deposition temperature above about 375° C. The highest growth rates were achieved at deposition temperature of about 500° C. At this deposition temperature the substrates were covered with purple or brown $MoS_2$ films.

Figure 6:
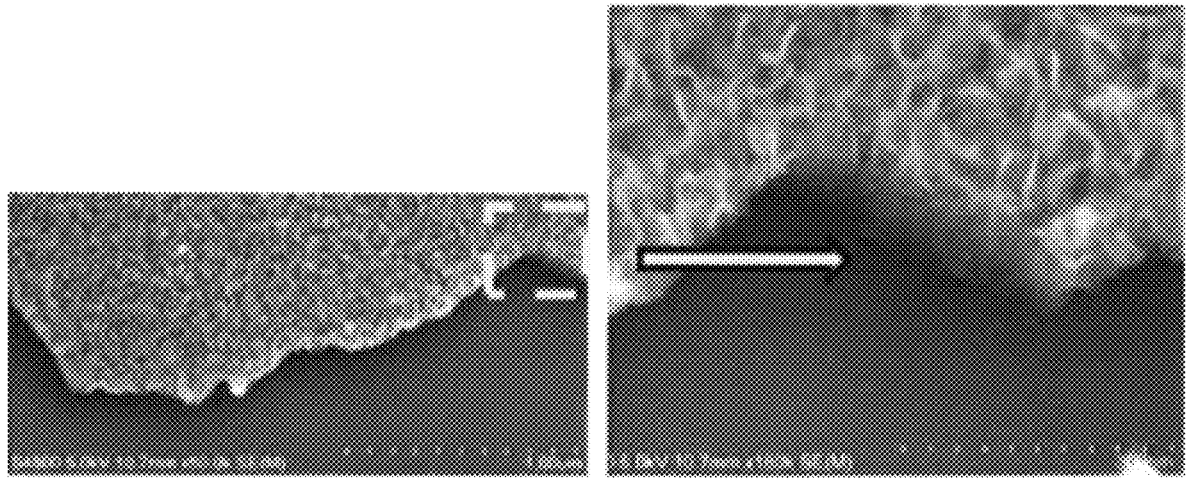
FIG. 6 is a field emission scanning electron microscope (FESEM) image of a $MoS_2$ thin film.

The resultant $MoS_2$ films were characterized with FESEM and film morphologies were found to be substantially identical, independent of which substrate the film was deposited on. Flake-like structure were observed on the surface of some films, however cross-sectional FESEM images revealed that the films are dense, with no cracks or pinholes, as shown in FIG. 6.

Figure 7:
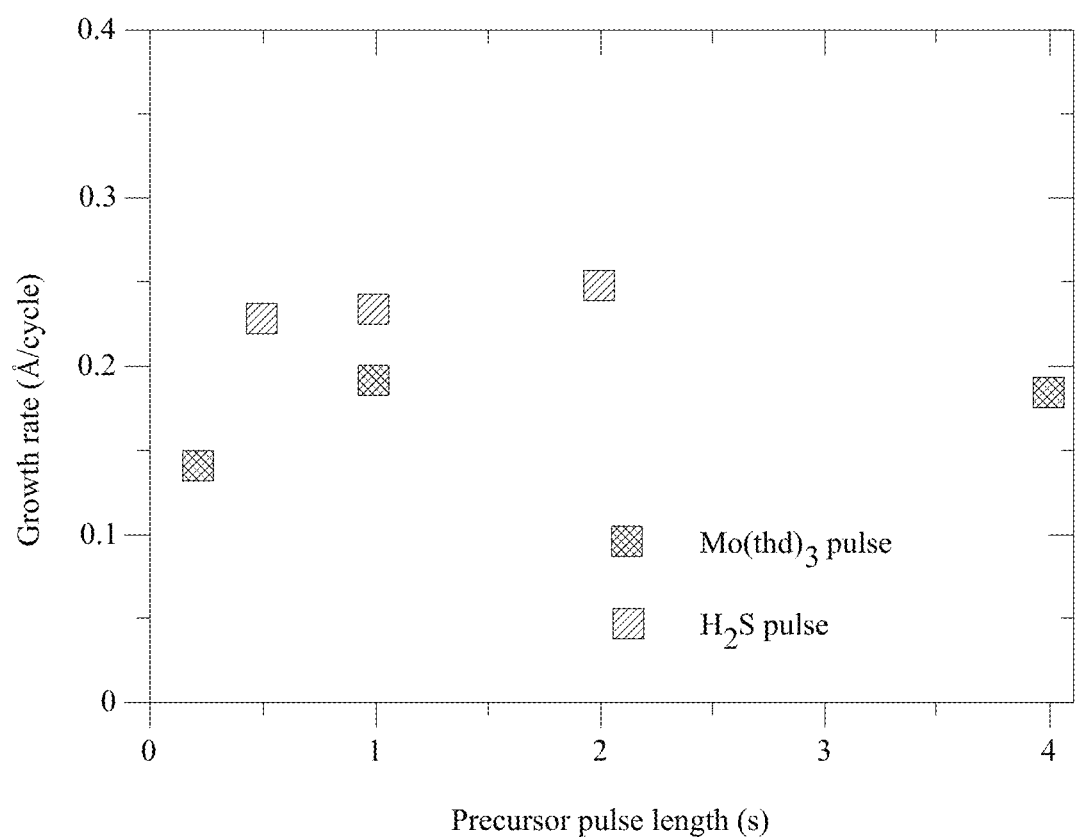
FIG. 7 is a graph of the growth rate per cycle of $MoS_2$ thin films versus the pulse length of $Mo(thd)_3$ and $H_2S$ precursors.
Figure 8:
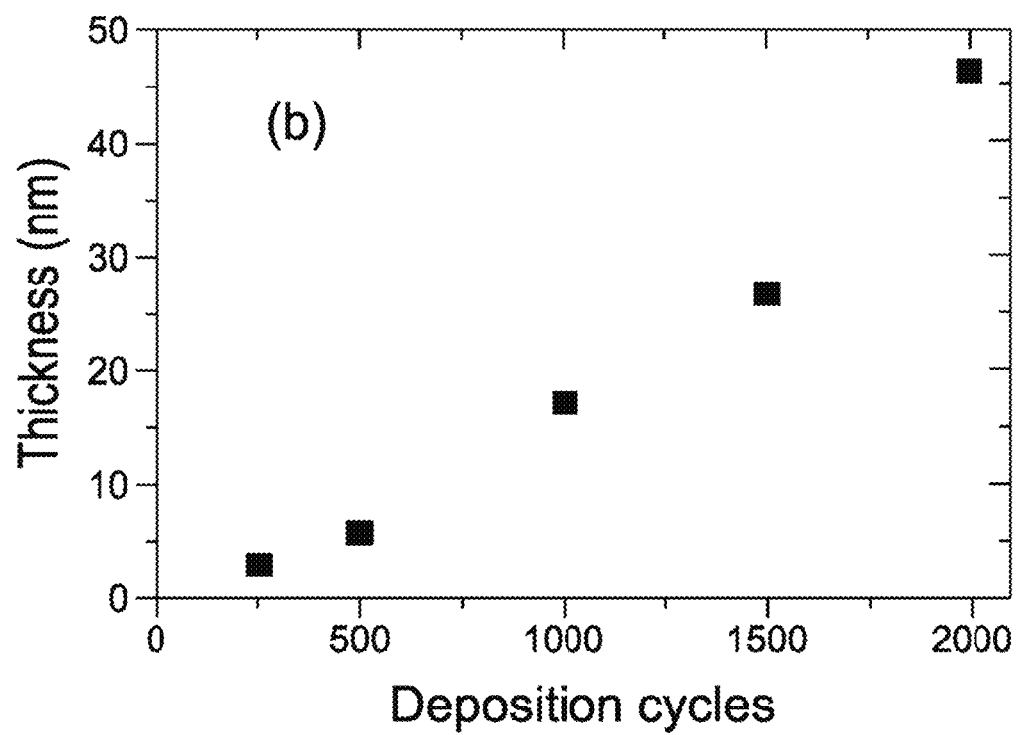
FIG. 8 is a graph of film thickness versus the number of deposition cycles.

The growth rate of the ALD $MoS_2$ films saturated at about 0.2 Å/cycle with both $Mo(thd)_3$ and $H_2S$ pulse lengths of about 0.5 to 1 second, as depicted in FIG. 7. Film thickness was observed to increase in a substantially linear manner, as depicted in FIG. 8, although an incubation period may be present, as indicated by the slightly steeper slope after 500 deposition cycles.

Figure 9:
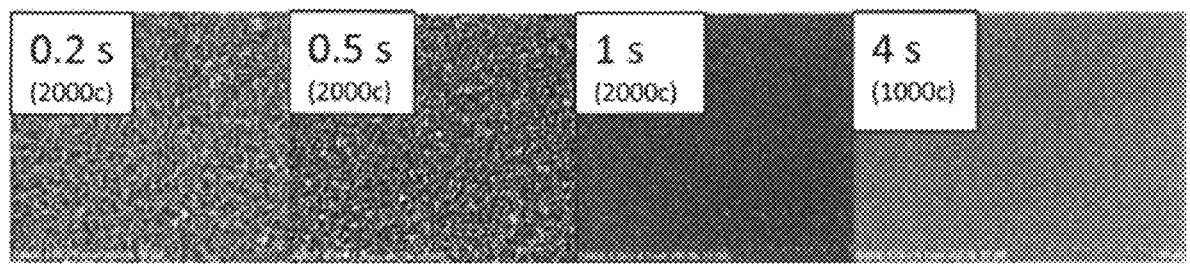
FIG. 9 is a series of field emission scanning electron microscope (FESEM) images of $MoS_2$ thin films deposited at 500° C. with varying $Mo(thd)_3$ precursor pulse lengths.

Although increasing $Mo(thd)_3$ pulse length did not affect the growth rate, film morphologies were affected. FIG. 9 illustrates that films deposited with 0.2 and 0.5 second pulses have nearly identical surfaces comprising sharp flake-like structures. Although no difference in film thickness was observed, $Mo(thd)_3$ pulse lengths of 1 second or longer resulted in a surface comprising grains. A similar surface structure was also observed for a $Mo(thd)_3$ pulse length of 4 seconds, although the resultant film was deposited using 1000 deposition cycles, as compared to 2000 cycles for the films deposited using 0.2, 0.5, and 1 second $Mo(thd)_3$ pulse lengths. Therefore, film thickness may affect the structural differences in the surface, with $Mo(thd)_3$ pulse length likely also having an effect.

Figure 10:
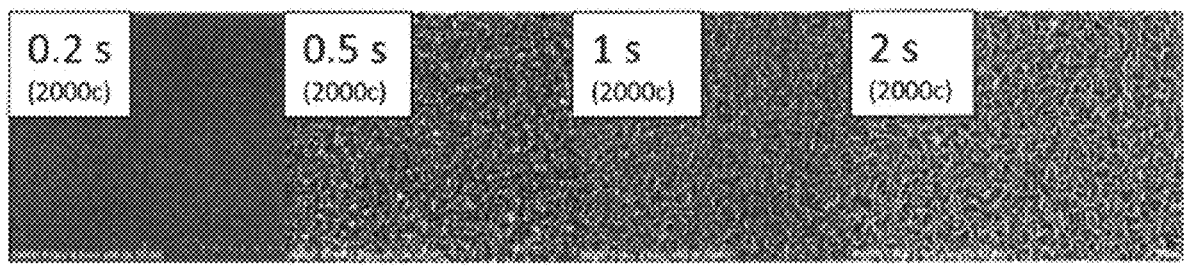
FIG. 10 is a series of field emission scanning electron microscope (FESEM) images of $MoS_2$ thin films deposited at 500° C. with varying $H_2S$ precursor pulse lengths.

Varying the $H_2S$ pulse length resulted in similar differences in film surface structure, although here a shorter $H_2S$ pulse length resulted in a flake-free surface. As shown in FIG. 10 an $H_2S$ pulse length of 0.2 seconds resulted in a film with a surface comprising grains. Longer pulses resulted in a surface comprising sharp-edged flakes.

Figure 11A:
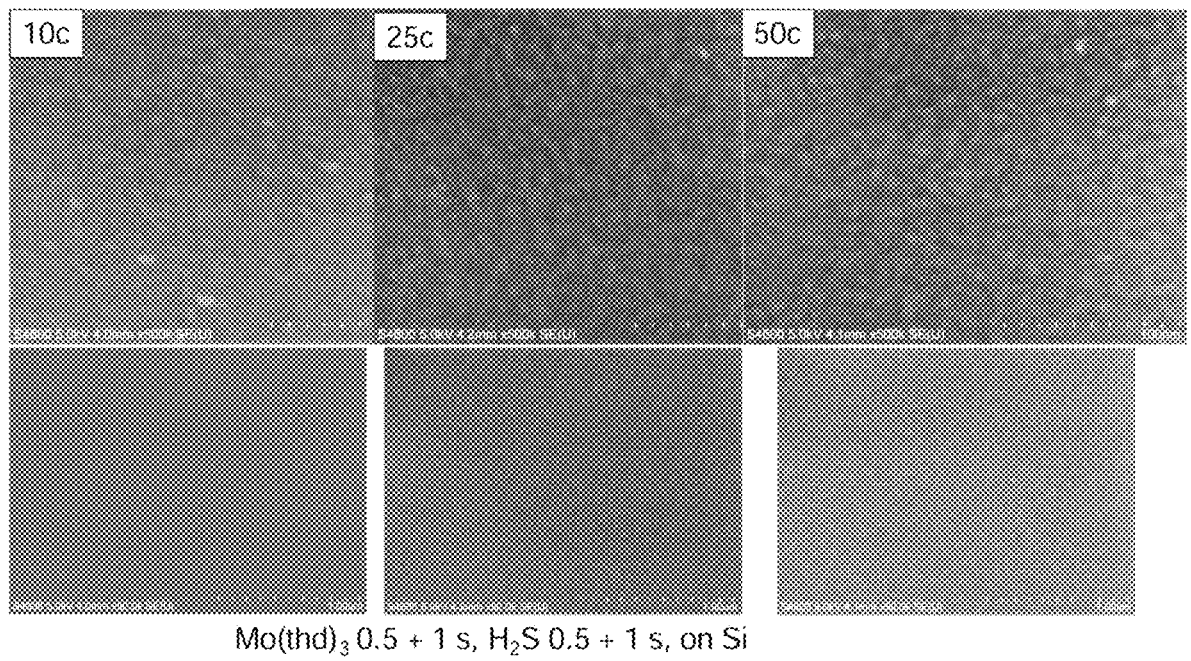
FIG. 11A is a series of field emission scanning electron microscope (FESEM) images of $MoS_2$ thin films deposited at 500° C. by between 10 and 50 deposition cycles.
Figure 11B:
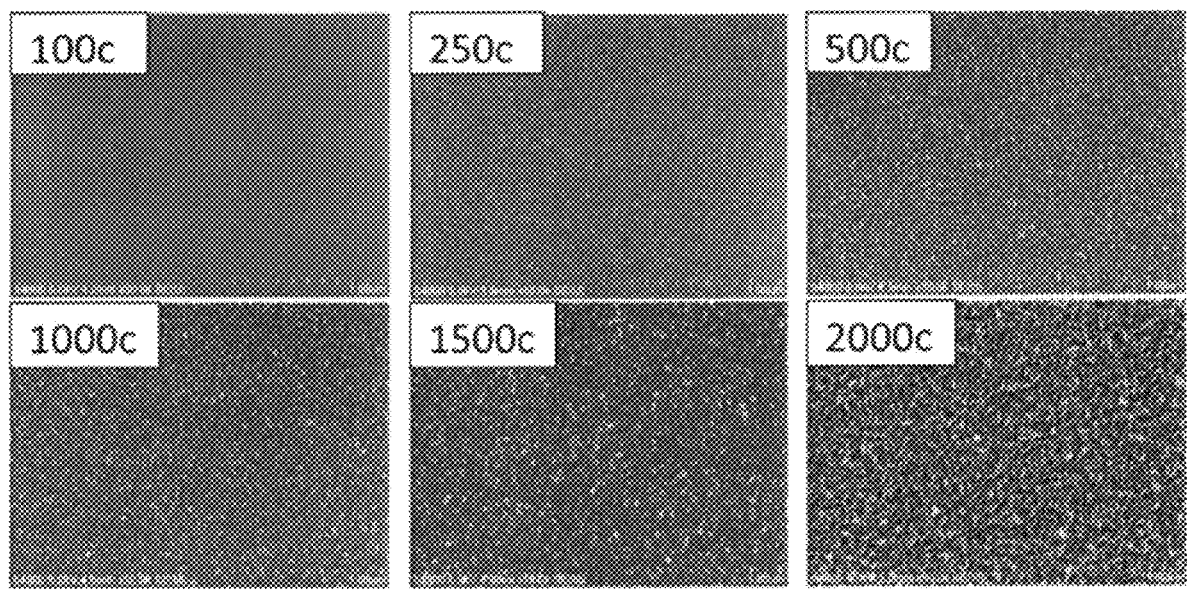
FIG. 11B is a series of field emission scanning electron microscope (FESEM) images of $MoS_2$ thin films deposited at 500° C. by between 100 and 2000 deposition cycles.

$MoS_2$ film growth was visually analyzed for $MoS_2$ films deposited by between 10 and 2000 deposition cycles. $Mo(thd)_3$ was used as a Mo precursor with a pulse time of 0.5 seconds and a purge time of 1 second, while $H_2S$ was used as a chalcogen precursor with a pulse time of 0.5 seconds and a purge time of 1 second. The deposition temperature for all samples was 500° C. FIG. 11A illustrates $MoS_2$ films deposited by between 10 and 50 cycles, while FIG. 11B shows $MoS_2$ films deposited by between 100 and 2000 cycles. The presence of sharp flakes on the film surface appears to be thickness dependent, with the surface structure of the film appearing to be crystalline and mostly flat up to 1500 deposition cycles. After 2000 deposition cycles raised flake structures cover the whole surface of the film.

Figure 12A:
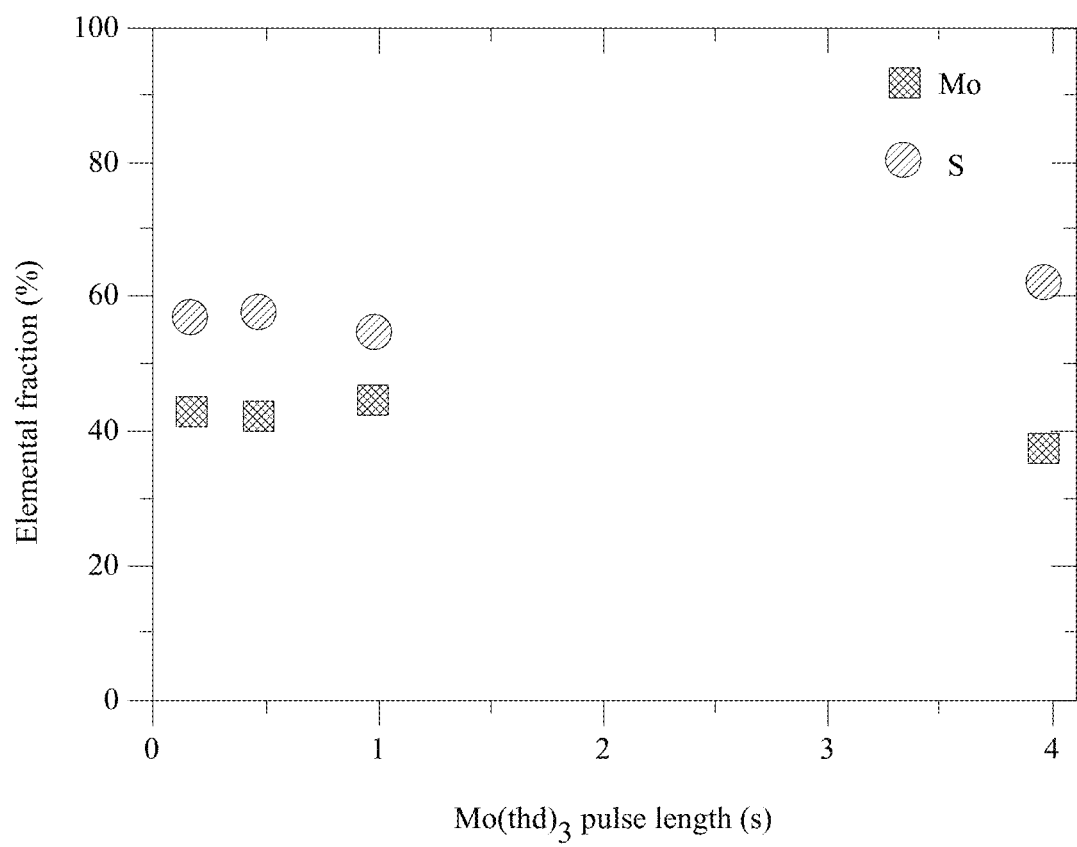
FIG. 12A is a graph of the composition of $MoS_2$ thin films deposited with varying $Mo(thd)_3$ precursor pulse lengths as measured by energy dispersive x-ray (EDX) analysis.
Figure 12B:
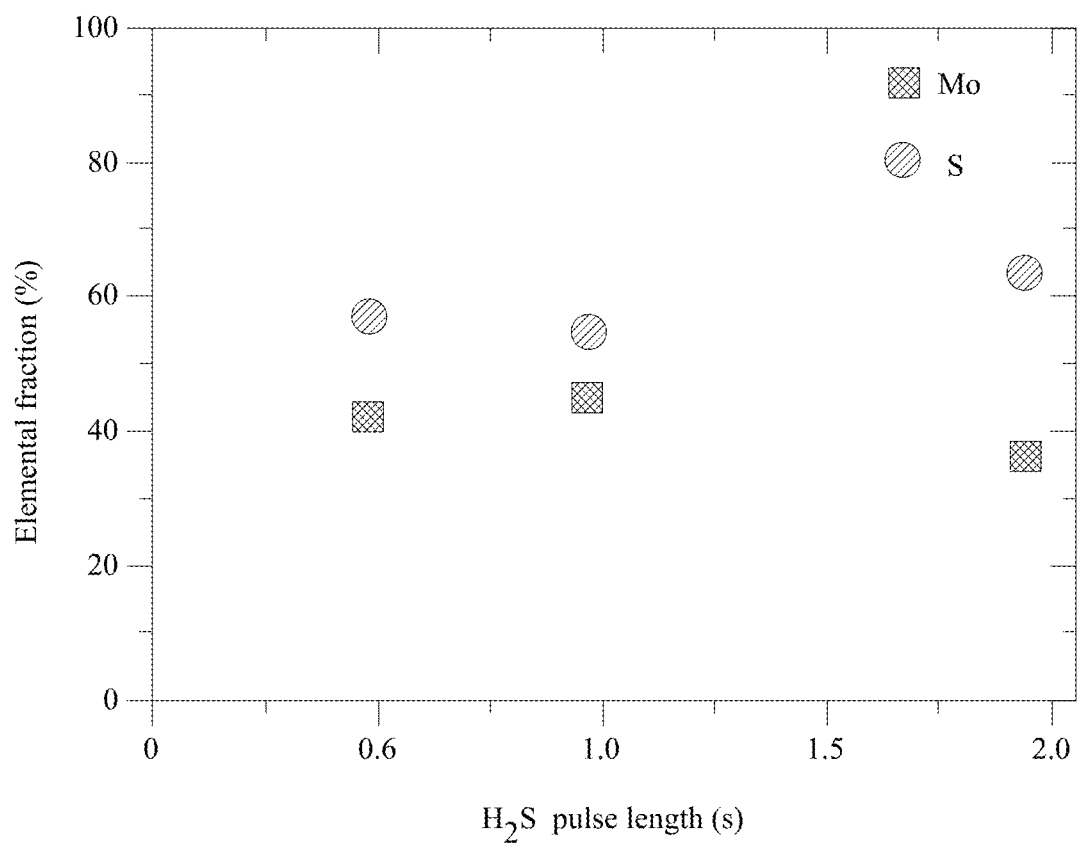
FIG. 12B is a graph of the composition of $MoS_2$ thin films deposited with varying $H_2S$ precursor pulse lengths as measured by energy dispersive x-ray (EDX) analysis.

The composition of the deposited $MoS_2$ films was analyzed by EDX. A theoretical film composition of $Mo_{35}S_{65}$ was obtained by using Oxford INCA software to synthesize a spectrum for a theoretical sample consisting of a $MoS_2$ film on a silicon substrate. As shown in FIG. 12A, the composition of $MoS_2$ films deposited at 500° C. was analyzed by EDX while the $Mo(thd)_3$ pulse length was varied. As shown in FIG. 12B, the composition of $MoS_2$ films deposited at 500° C. was analyzed by EDX while the $H_2S$ pulse length was varied. In both cases the measured $MoS_2$ film compositions were determined to be similar to the theoretical composition.

Figure 13:
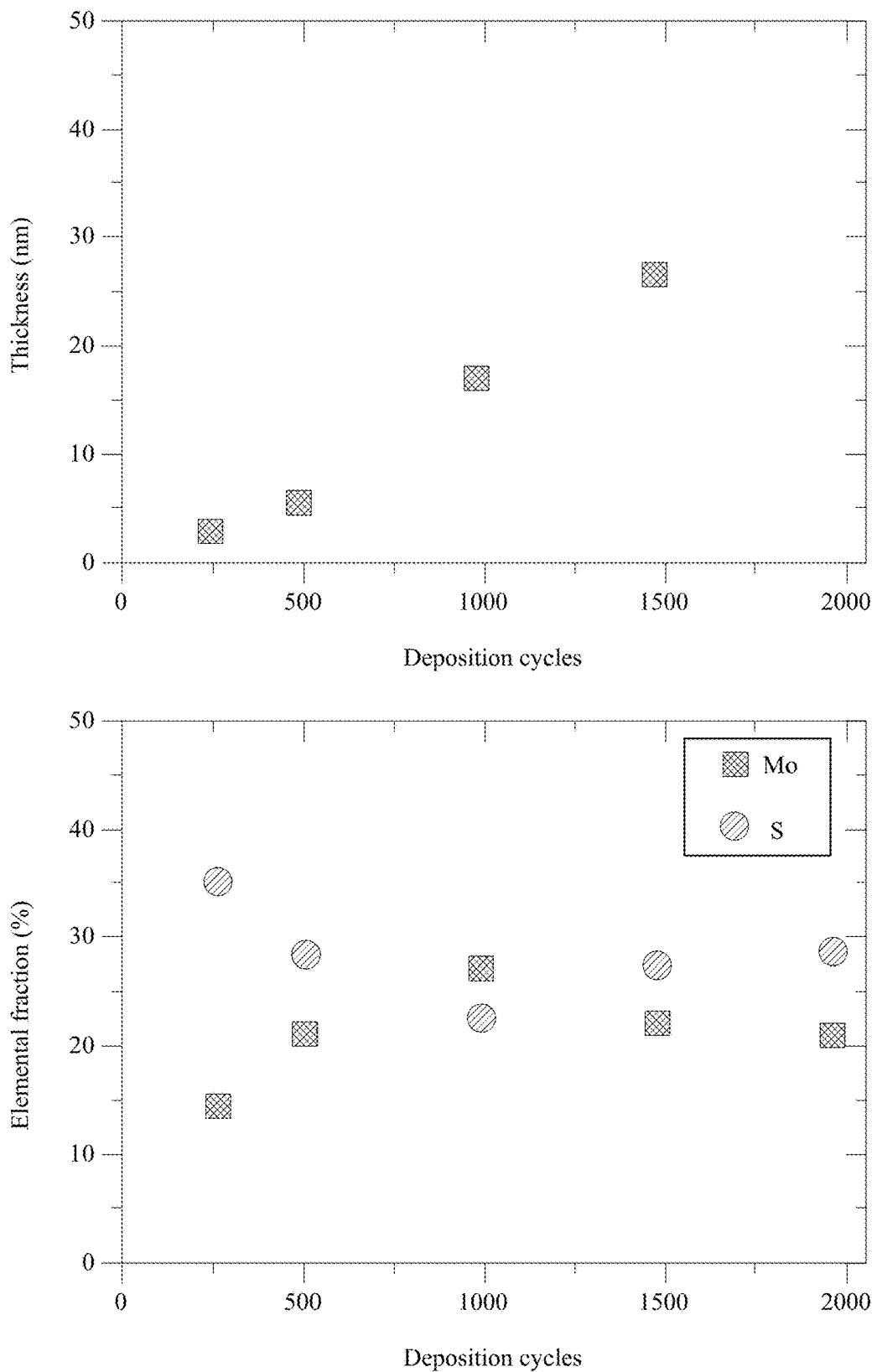
FIG. 13 illustrates the $MoS_2$ film thickness and elemental fraction of Mo and S versus the number of deposition cycles.

The elemental fraction of MoS2 film samples deposited at 500° C. by an ALD process was also measured and is illustrated in FIG. 13. MoS2 films were deposited by ALD processes having from 250 to 2000 deposition cycles. As the number of deposition cycles increased, the measured elemental fraction of the MoS2 films went from being Mo rich to S rich. A MoS2 sample deposited by an ALD process having 2000 deposition cycles had a measured composition of $Mo_{42}S_{58}$. The thicknesses of the deposited films was observed to increase approximately linearly, as illustrated in FIG. 13, although an incubation period may be present.

Figure 14:
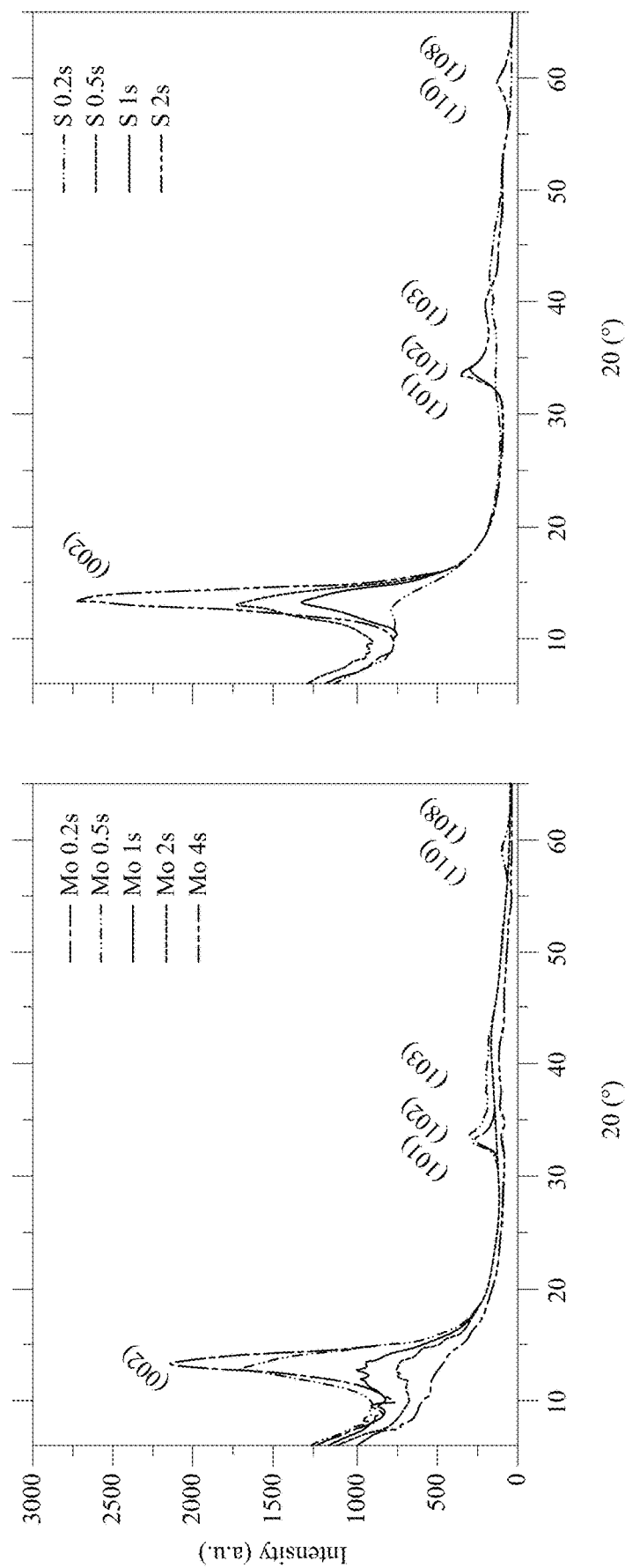
FIG. 14 illustrates the grazing incidence X-ray diffraction (GIXRD) patterns for $MoS_2$ thin films deposited with varying chalcogen and Mo precursor pulse lengths.

The compositions of two sets of deposited $MoS_2$ film samples were analyzed by grazing incidence X-ray diffraction (GIXRD) as illustrated in FIG. 14. One set of sample $MoS_2$ films were deposited by an ALD process wherein the sulfur precursor pulse was kept constant at 0.5 seconds while the Mo precursor pulse time was varied from 0.2 seconds to 4 seconds. A second set of sample $MoS_2$ films were deposited by an ALD process wherein the Mo precursor pulse was kept constant at 0.5 seconds while the sulfur precursor pulse time was varied from 0.2 seconds to 2 seconds. The samples were deposited at 500° C. The intensity of the (002) peak shown in FIG. 14 increased as Mo precursor pulse times decreased and increased as sulfur precursor pulse times increased.

Figure 15:
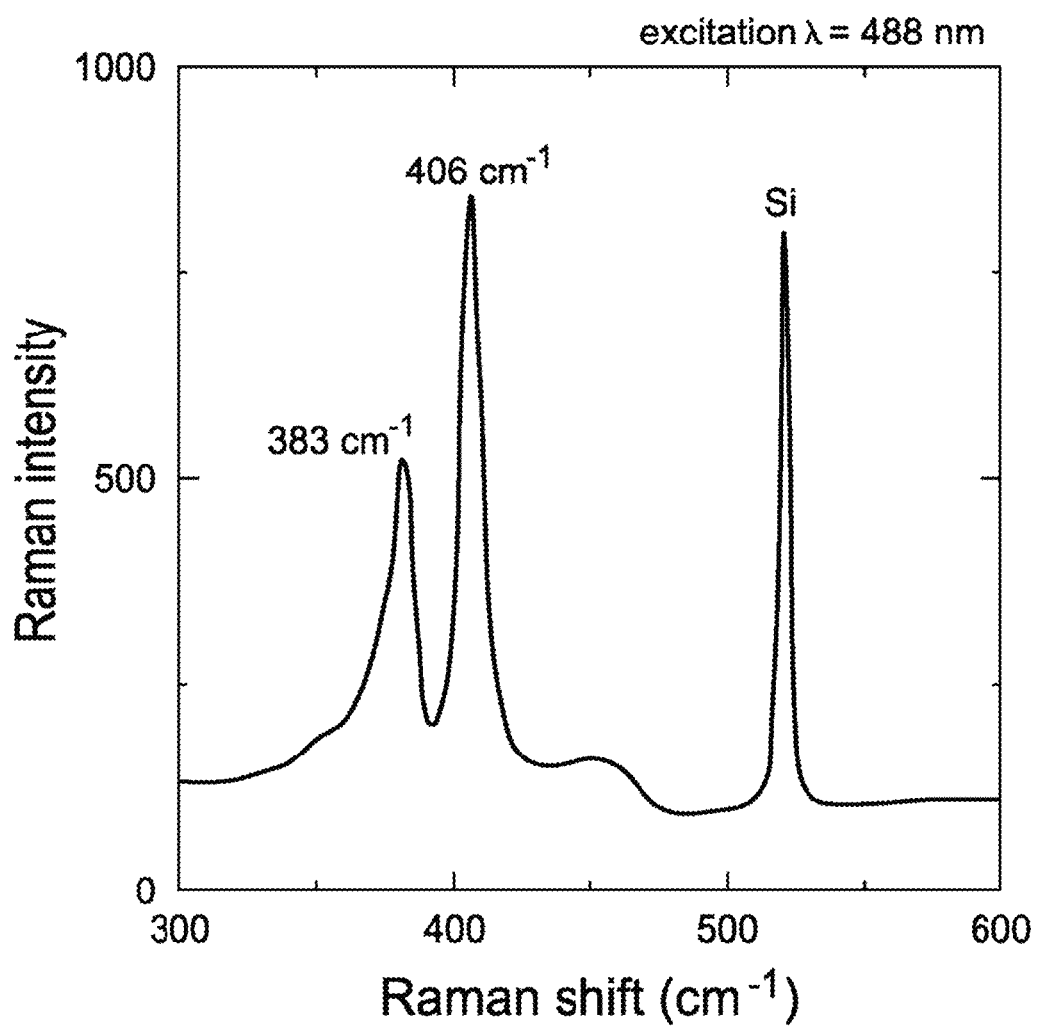
FIG. 15 is a Raman spectrum of a $MoS_2$ thin film.

Raman spectroscopy was used to identify the phase of the deposited films. $MoS_2$ has characteristic peaks at 383 $cm^{-1}$ for in-plane vibration of Mo and S atoms and at 406 $cm^{-1}$ for out-of-plane vibration of S atoms. As depicted in FIG. 15, both of these peaks are clearly visible for the deposited $MoS_2$ thin film.

Figure 16:
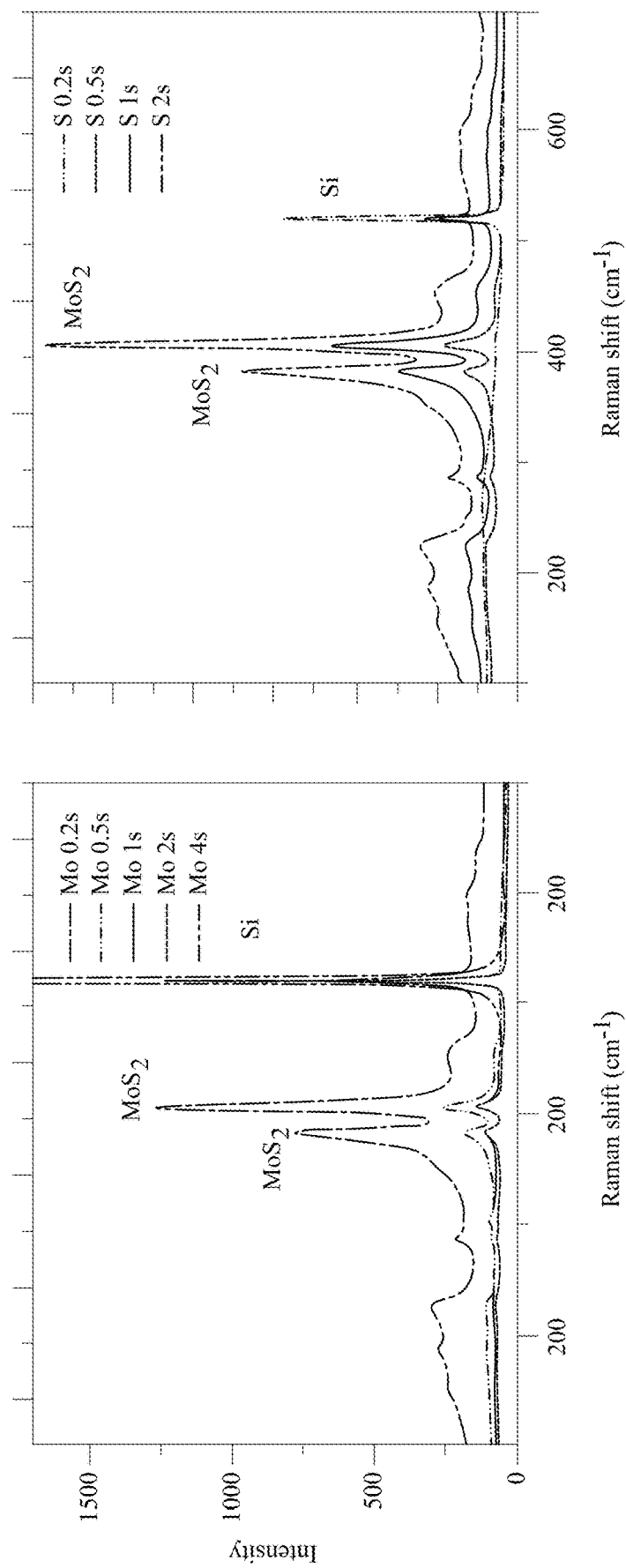
FIG. 16 illustrates the Raman spectra for $MoS_2$ thin films deposited with varying chalcogen and Mo precursor pulse lengths.

Raman spectroscopy was also used to analyze the phases of two sets of deposited $MoS_2$ film samples as illustrated in FIG. 16. One set of sample $MoS_2$ films were deposited by an ALD process wherein the sulfur precursor pulse was kept constant at 0.5 seconds while the Mo precursor pulse time was varied from 0.2 seconds to 4 seconds. A second set of sample $MoS_2$ films were deposited by an ALD process wherein the Mo precursor pulse was kept constant at 0.5 seconds while the sulfur precursor pulse time was varied from 0.2 seconds to 2 seconds. The samples were deposited at 500° C. The intensity of the in-plane and out-of-plane $MoS_2$ peaks were observed to increase with decreasing MO precursor pulse time and were observed to increase with increasing sulfur precursor pulse times.

Figure 17:
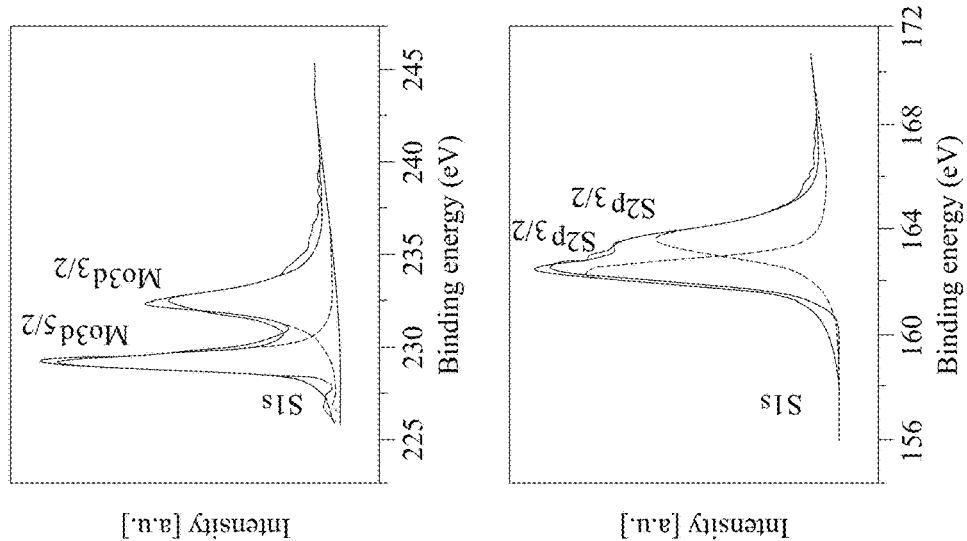
FIG. 17 illustrates elemental composition of two $MoS_2$ thin films as analyzed by X-ray photoelectron spectroscopy (XPS)
Figure 17:
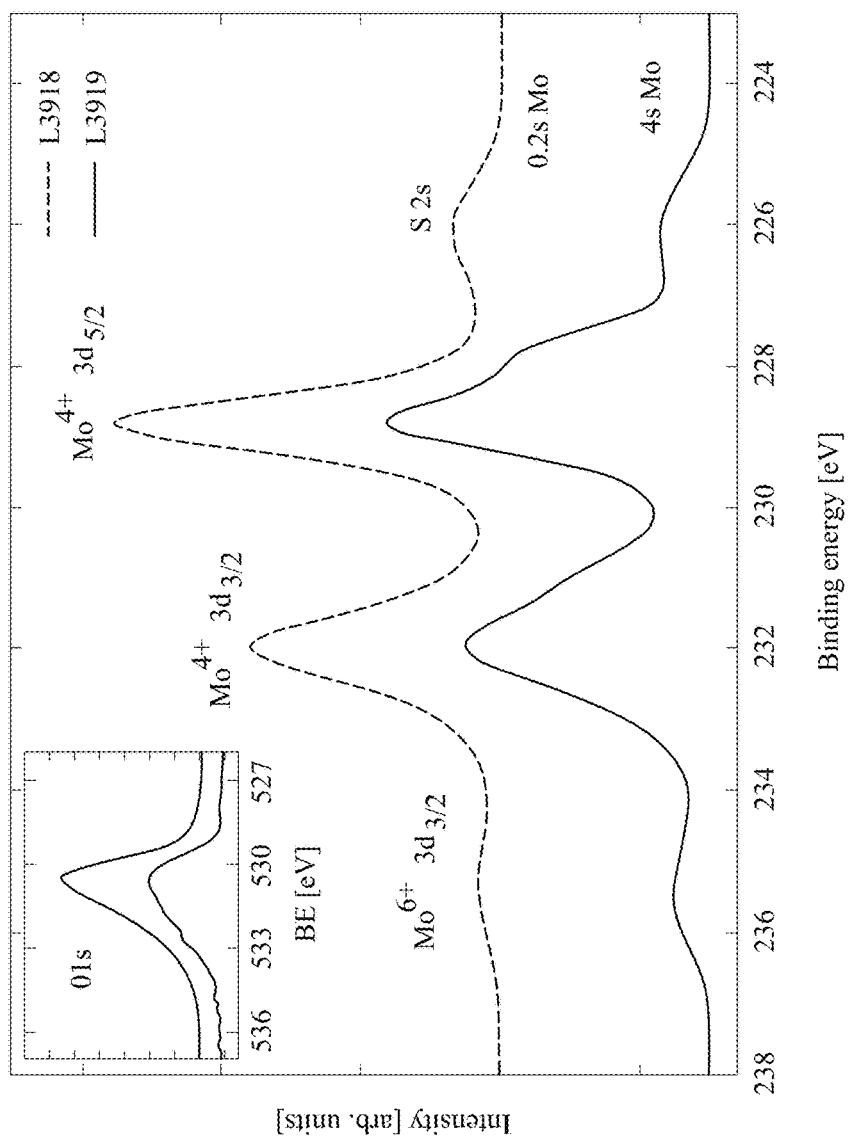

The elemental composition of two $MoS_2$ thin film samples deposited by an ALD process was investigated using X-ray photoelectron spectroscopy (XPS) as illustrated in FIG. 17. One sample was deposited by an ALD process with a Mo precursor pulse of 0.2 seconds while a second sample was deposited by an ALD process with a Mo precursor pulse time of 4 seconds.

Figure 18:
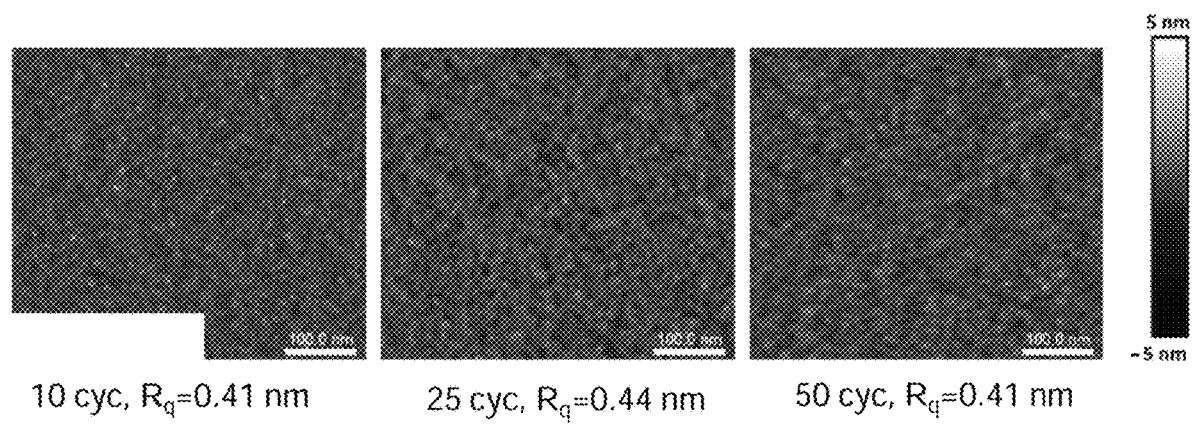
FIG. 18 illustrates the surface roughness of MoS2 thin films as analyzed using atomic force microscopy (AFM)

The surface roughnesses of $MoS_2$ film samples deposited by an ALD process using $Mo(thd)_3$ as a Mo precursor and having between 10 and 50 deposition cycles was also investigated using atomic force microscopy (AFM) as illustrated in FIG. 18. The roughness about the samples deposited by 10 and 50 cycles was found to be 0.41 nm, while the roughness of the sample deposited by 25 cycles was found to be 0.44 nm. The surface features of the films were under 10 nm in size for all samples, while the size of the surface features appeared to increase with the number of deposition cycles.

Figure 19:
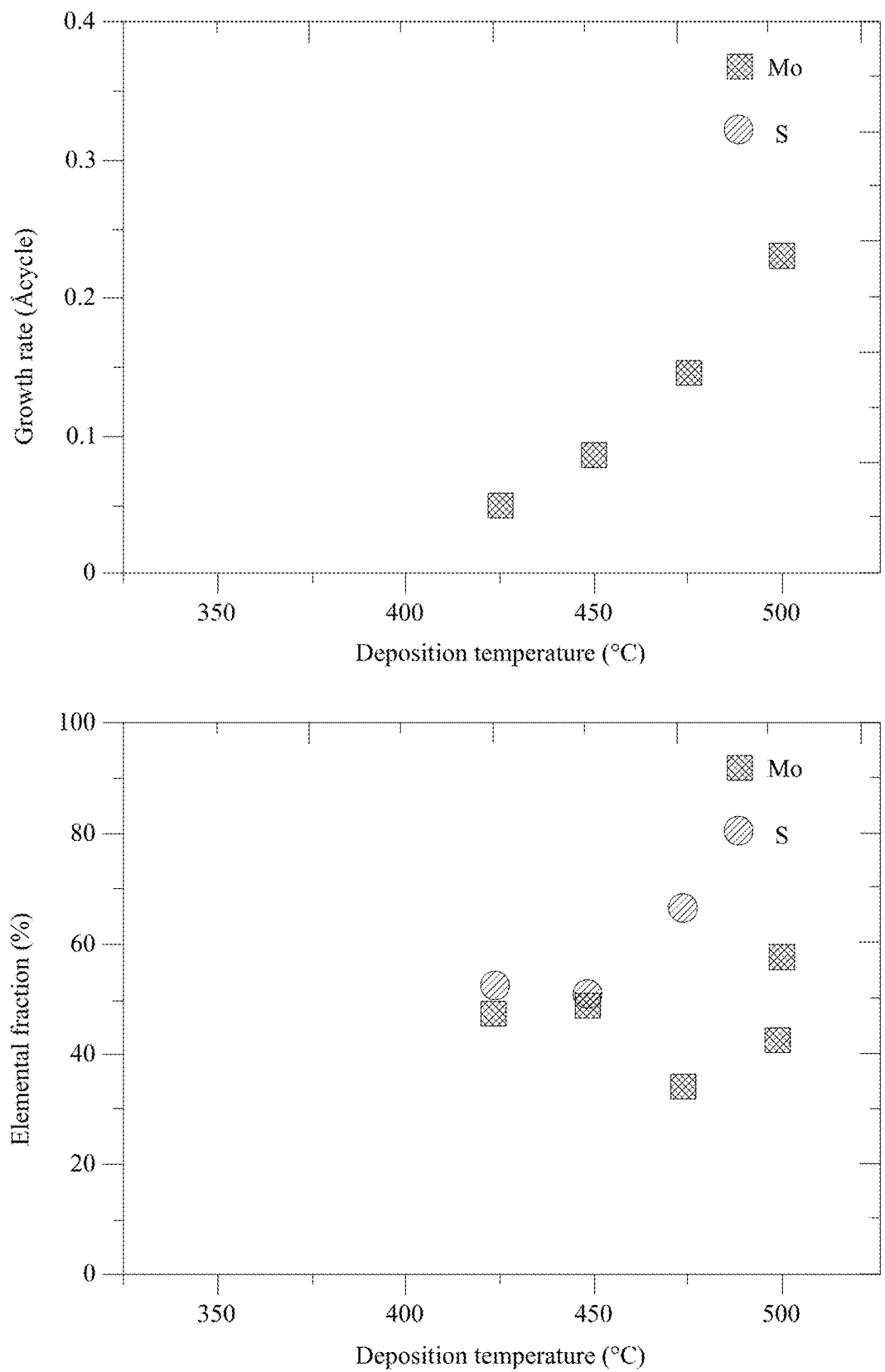
FIG. 19 illustrates the $MoS_2$ thin film growth rate and elemental fraction of Mo and S versus deposition temperature.

FIG. 19 illustrates the growth rate and elemental fraction for MoS2 films deposited by ALD processes using $Mo(thd)_3$ as a Mo precursor and deposited at temperatures from 425° C. to 500° C. The growth rate was observed to increase with increasing deposition temperature and the highest growth rate was observed at a deposition temperature of 500° C. The compositions of the deposited films varied with deposition temperature.

Figure 20:
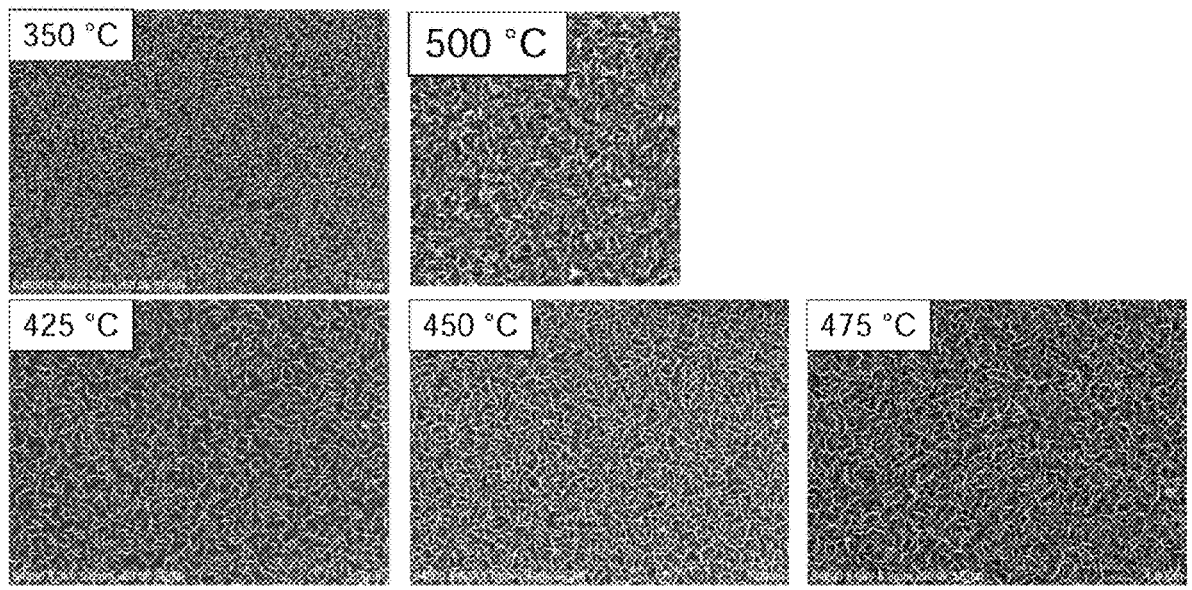
FIG. 20 is a series of field emission scanning electron microscope (FESEM) images of $MoS_2$ thin films deposited between 350° C. and 500° C.

As illustrated in FIG. 20, $MoS_2$ film growth was visually analyzed for $MoS_2$ films deposited by ALD. $Mo(thd)_3$ was used as a Mo precursor with a pulse time of 0.5 seconds and a purge time of 1 second, while $H_2S$ was used as a chalcogen precursor with a pulse time of 0.5 seconds and a purge time of 1 second. The deposition temperature was varied from 350° C. to 500° C.

2D Materials

The ALD processes described herein may be used to deposit 2D materials comprising Mo or W, for example Mo or W dichalcogenides such as $MoS_2$, $WS_2$, $MoSe_2$, or $WSe_2$ 2D materials. 2D materials, also referred to as single layer materials, are materials that consist of a single connected molecular monolayer. While 2D materials form a single connected molecular monolayer, multiple monolayers may be deposited by the deposition processes disclosed herein. For example, in the case of 2D $MoS_2$, the 2D material comprises a single layer of covalently bonded $MoS_2$ molecules, arranged so that one layer of Mo atoms is sandwiched between two layers of S atoms. The basic atomic structure of a $MoS_2$ will be familiar to the skilled artisan.

Due to their unusual characteristics, 2D materials are useful in a wide variety of potential applications, for example as lubrication, in optoelectronics, spintronics and valleytronics, in THz generation and detection, for use as catalysts, chemical and biological sensors, supercapacitors, LEDs, solar cells, Li-ion batteries, and as MOSFET channel materials.

Unlike other 2D materials such as graphene, 2D Mo or W dichalcogenides possess unique electronic properties that make them useful for semiconductor device miniaturization. For example, unlike graphene, 2D Mo or W dichalcogenides have a direct band gap and are semiconducting. Therefore, Mo or W dichalcogenides are useful in electronic devices, for example Mo or W dichalcogenides can be used as a channel material in a gate stack or transistors.

According to some embodiments a 2D material comprising Mo or W can be deposited by ALD according to the methods disclosed herein. In some embodiments a 2D material comprising Mo or W may comprise less than or equal to ten molecular monolayers of a compound comprising Mo or W, preferably less than 5 molecular monolayers, most preferably less than or equal to 3 molecular monolayers.

In some embodiments the 2D material comprising Mo or W may comprise less than or equal to ten molecular monolayers of a Mo or W dichalcogenide, preferably less than 5 molecular monolayers, most preferably less than or equal to 3 molecular monolayers. In some embodiments the 2D material comprising Mo or W may comprise less than or equal to ten molecular monolayer of $MoS_2$, $WS_2$, $MoSe_2$, $WSe_2$, $MoTe_2$, or $WTe_2$, preferably less than 5 molecular monolayers, most preferably less than or equal to 3 molecular monolayers.

In some embodiments a method for depositing a 2D material comprising Mo or W on a substrate may comprise an ALD process as disclosed herein comprising multiple cycles. In some embodiments a method for depositing a 2D material comprising Mo or W may comprise an ALD process as disclosed herein comprising less than or equal to 500 deposition cycles, preferably less than or equal to 200 deposition cycles, most preferably less than or equal to 100 deposition cycles. As can be selected by the skilled artisan depending on the particular precursors, substrate and process conditions, a method for depositing a 2D material comprising Mo or W on a substrate may comprise an ALD process as disclosed herein comprising less than or equal to 50 cycles, less than or equal to 25 cycles, less than or equal to 15 cycles, or less than or equal to 10 cycles.

In some embodiments the deposited 2D material comprising Mo or W may be less than 10 nm, more preferably less than 5 nm, more preferably less than 3 nm, more preferably less than 2 nm, more preferably less than 1.5 nm, and most preferably less than 1.0 nm.

In some embodiments the deposited 2D material has a roughness ($R_q$) of less than about 0.75 nm, preferably less than about 0.5 nm and most preferably less than or equal to about 0.4 nm. Roughness, for example, can be measured with atomic force microscopy (AFM) or with X-ray reflection (XRR). In the case of ultrathin 2D-material films, AFM may be a preferred method.

In some embodiments the 2D material comprising Mo or W is able to be used in an electronic device, for example as the channel material in a gate stack. In some embodiments a 2D material comprising Mo or W may be deposited after the gate dielectric, that is, channel-last. In some embodiments a 2D material comprising Mo or W may be deposited prior to the gate dielectric, that is, channel-first. In some embodiments the gate stack may be manufactured upside down, such that the channel is above the gate in the gate stack.

Figure 21:
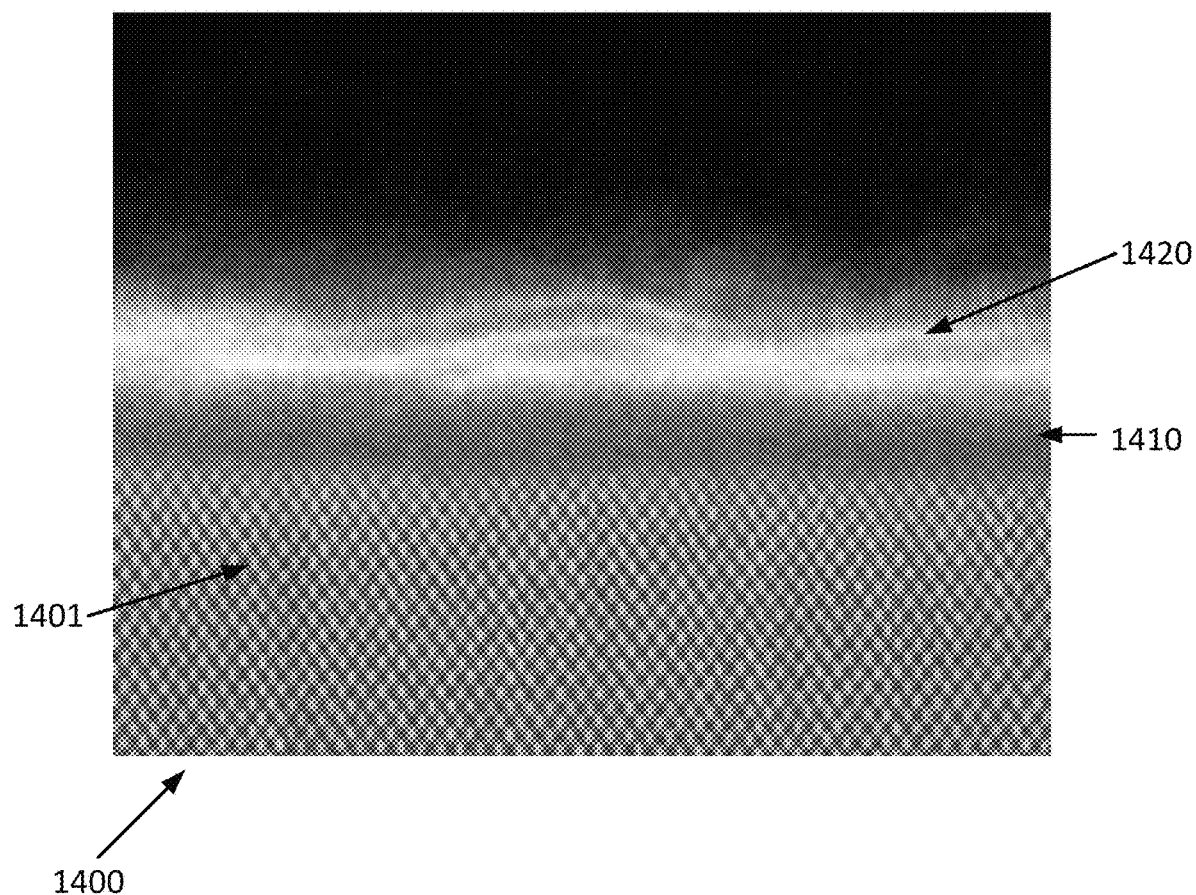
FIG. 21 is an aberration-corrected scanning tunneling electron microscope (AC-STEM) image of a $MoS_2$ thin film deposited on a silicon substrate including a native oxide.

FIG. 21 is an aberration-corrected scanning tunneling electron microscope (AC-STEM) image of a $MoS_2$ thin film 1420 deposited on a silicon substrate 1400 including a native oxide 1410. The silicon atoms 1401 of the substrate 1400 can be seen as white dots in the lower half of the image, while the native oxide 1410 is the darker layer between $MoS_2$ thin film 1420 and the silicon substrate 1400. The $MoS_2$ shown here is about 2 to 3 molecular layers and has a thickness of about 10-15 Å. The spacing between the molecular monolayers is about 6-8 Å, which is in the predicted range for $MoS_2$.

The terms "film" and "thin film" are used herein for simplicity. "Film" and "thin film" are meant to mean any continuous or non-continuous structures and material deposited by the methods disclosed herein. For example, "film" and "thin film" could include 2D materials, nanorods, nanotubes or nanoparticles or even single partial or full molecular layers or partial or full atomic layers or clusters of atoms and/or molecules. "Film" and "thin film" may comprise material or layer with pinholes, but still be at least partially continuous.

The term chalcogen as used herein is meant to refer primarily to the chemical elements sulfur, selenium, and tellurium, although in some cases, as will be clear to those of ordinary skill in the art the term may also refer to oxygen. Similarly, the terms chalcogenide and dichalcogenide are mean to refer primarily to sulfides, selenides, and tellurides, although in some cases, as will be clear to those of ordinary skill in the art such terms may also refer to oxides.

Although the foregoing invention has been described in terms of certain preferred embodiments, other embodiments will be apparent to those of ordinary skill in the art. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

What is claimed is:

1. A Mo or W beta-diketonate precursor selected from the group consisting of: $W(thd)_3$, $Mo(fod)_3$, $W(fod)_3$, and $W(hfac)_3$, wherein thd is 2,2,6,6-tetramethyl-3,5-heptanedionato; fod is 2,2-dimethyl-6,6,7,7,8,8,8-heptafluoro-3,5-octanedione; and hfac is hexafluoroacetylacetonato [1,1,1,5,5,5-hexafluoro-2,4-pentanedionato].

2. The precursor of claim 1, wherein the precursor is $Mo(fod)_3$.

3. The precursor of claim 1, wherein the precursor is $W(thd)_3$, $W(fod)_3$, or $W(hfac)_3$.

4. The precursor of claim 3, wherein the precursor is $W(thd)_3$.

5. A gaseous composition comprising (i) a Mo or W beta-diketonate precursor of claim 1; and (ii) an inert gas carrier.

6. The gaseous composition according to claim 5, wherein the Mo or W beta-diketonate precursor is $W(thd)_3$.

* * * * *